US012140651B2

(12) United States Patent
Ferrando et al.

(10) Patent No.: US 12,140,651 B2
(45) Date of Patent: Nov. 12, 2024

(54) METHOD FOR CORRECTING INHOMOGENEITY OF THE STATIC MAGNETIC FIELD PARTICULARLY OF THE STATIC MAGNETIC FIELD GENERATED BY THE MAGNETIC STRUCTURE OF A MACHINE FOR ACQUIRING NUCLEAR MAGNETIC RESONANCE IMAGES AND MRI SYSTEM FOR CARRYING OUT SUCH METHOD

(71) Applicant: Esaote S.p.A., Genoa (IT)

(72) Inventors: Fabrizio Ferrando, Genoa (IT); Vincenzo Punzo, San Giorgio a Cremano (IT); Rosario Varriale, Naples (IT)

(73) Assignee: Esaote S.p.A., Genoa (IT)

( * ) Notice: Subject to any disclaimer, the term of this patent is extended or adjusted under 35 U.S.C. 154(b) by 30 days.

(21) Appl. No.: 17/505,097

(22) Filed: Oct. 19, 2021

(65) Prior Publication Data

US 2022/0120833 A1 Apr. 21, 2022

(30) Foreign Application Priority Data

Oct. 19, 2020 (EP) .................................... 20202522

(51) Int. Cl.
*G01R 33/3873* (2006.01)
*G01R 33/48* (2006.01)
(Continued)

(52) U.S. Cl.
CPC ......... *G01R 33/3873* (2013.01); *G01R 33/48* (2013.01); *G06N 20/00* (2019.01); *G01R 33/3875* (2013.01)

(58) Field of Classification Search
CPC .... G01R 33/443; G01R 33/543; G01R 33/48; G01R 33/243
See application file for complete search history.

(56) References Cited

U.S. PATENT DOCUMENTS 6,252,402 B1 6/2001 Sanfilippo et al.
7,332,912 B2 2/2008 Pittaluga et al.
(Continued)

FOREIGN PATENT DOCUMENTS

EP 0940686 A1 9/1999
EP 1656632 A1 5/2006
(Continued)

OTHER PUBLICATIONS

W.W. Jiao, Z.R. Dong, W. Sun, et al., Method of artificial neural network for shimming of NMR magnet, J Grad School Chin Acad Sci, 23 (2) (2006), pp. 149-154 (Year: 2006).*
(Continued)

*Primary Examiner* — Daniel R Miller
(74) *Attorney, Agent, or Firm* — Buchanan Ingersoll & Rooney PC

(57) ABSTRACT

Shimming a magnetic field includes measuring the magnetic field and sampling it in a plurality of locations; defining a grid for positioning correction elements; calculating the position and magnitude parameters of one or more correction elements to obtain predetermined target values of the field characteristics, wherein an algorithm has been trained by a database of known cases in which each record links a certain initial magnetic field of a magnetic structure to the pattern of correction elements on a positioning grid for these correction elements in the magnet structure, thereby delivering as an output a pattern of correction elements on the positioning grid, which contributions to the magnetic field of the magnet structure generate a magnetic field which at least best approximates or meets the predetermined target values of the field characteristics.

11 Claims, 11 Drawing Sheets

(51) Int. Cl.
 G06N 20/00 (2019.01)
 *G01R 33/3875* (2006.01)

(56) References Cited

U.S. PATENT DOCUMENTS

| | | |
|---|---|---|
| 7,711,662 B2 | 5/2010 | Buscema |
| 7,877,342 B2 | 1/2011 | Buscema |
| 2007/0229077 A1 | 10/2007 | Punzo et al. |
| 2014/0028311 A1 | 1/2014 | Punzo |

FOREIGN PATENT DOCUMENTS

| | | |
|---|---|---|
| EP | 1748300 A1 | 1/2007 |
| WO | 2004063831 A2 | 7/2004 |

OTHER PUBLICATIONS

B. Dorri, M. E. Vermilyea and W. E. Toffolo, "Passive shimming of MR magnets: algorithm, hardware, and results," in IEEE Transactions on Applied Superconductivity, vol. 3, No. 1, pp. 254-257, Mar. 1993, doi: 10.1109/77.233719 (Year: 1993).*
M. Abe, K. Sakakibara, T. Fujikawa and H. Hanada, "Static Magnetic Field Shimming Calculation Using TSVD Regularization With Constraints of Iron Piece Placements," in IEEE Transactions on Applied Superconductivity, vol. 27, No. 7, pp. 1-12, Oct. 2017, Art No. 4400812 (Year: 2017).*
X. C. Zhu, H. S. Wang, H. Wang and Y. Li, "A novel passive shimming method for 0.7T biplanar superconducting MRI," 2015 IEEE International Conference on Applied Superconductivity and Electromagnetic Devices (ASEMD), Shanghai, China, 2015, pp. 418-419 (Year: 2015).*

\* cited by examiner

METHOD FOR CORRECTING INHOMOGENEITY OF THE STATIC MAGNETIC FIELD PARTICULARLY OF THE STATIC MAGNETIC FIELD GENERATED BY THE MAGNETIC STRUCTURE OF A MACHINE FOR ACQUIRING NUCLEAR MAGNETIC RESONANCE IMAGES AND MRI SYSTEM FOR CARRYING OUT SUCH METHOD

TECHNICAL FIELD

The present application relates to a method for correcting inhomogeneity of the static magnetic field particularly of the static magnetic field generated by the magnetic structure of a machine for acquiring nuclear magnetic resonance images.

Furthermore, the present application relates to an MRI system for carrying out the above method.

BACKGROUND OF THE INVENTION

Correction of inhomogeneities of the magnetic field of an MRI magnet structure is currently known under the denomination of shimming.

Current methods for shimming magnetic fields of MRI apparatus magnets are based on analytical solutions of equations used to describe the magnetic field generated by a distribution of magnetic material. This kind of approach is relatively long and complex and requests highly specialized service persons. The equations and the solution of the equations allowing to carry out the corrections becomes more and more complex and time consuming with the shape of the gantry and of the ideal surface describing the limits of the imaging volume. Furthermore, the trend goes towards the use of magnetic structures which are very short and also as much as possible open.

EP0940686A1 discloses a method for correcting and/or calibrating magnetic fields, particularly intended for magnets in nuclear magnetic resonance imaging equipment comprising the steps of:

i) generating a polynomial representing the magnetic field generated by the magnet and comprising a plurality of harmonic terms, each associated to a coefficient;

ii) measuring the magnetic field and sampling it in a plurality of locations, with a predetermined space distribution;

iii) determining the coefficients from the sample values in the field;

iv) comparing the measured coefficients with those describing the field with the desired characteristics;

v) defining a grid for positioning the correction elements, depending on the magnet structure and on the correlation thereof with the field structure and positioning the grid inside the magnet structure so that the contribution of the correction elements positioned on the grid adds to the magnetic field generated by the magnetic structure;

vi) calculating the position and magnitude parameters of said one or more correction elements to obtain the desired field characteristics of the magnetic structure in combination with the contribution of the said one or more correction elements positioned on the said grid;

vii) repeating, if necessary, the sampling operation and the steps ii) to vi).

Generally the process needs more than one repetitions which adds correction elements to the grid so that the process of making the magnetic field homogeneous converges at each step to an optimal solution at least minimizing the differences between the desired magnetic field according to the computation and effective magnetic field, or generating a magnetic field which has inhomogeneities lower than a predetermined maximum threshold, typically of the order of some ppm.

In order to carry out the above steps document EP0940686 the morphology of the sampling volume of the magnetic field is defined;

h) the coefficients of the polynomial which can represent the magnetic field are analyzed and subdivided into independent groups, according to the symmetries of the selected reference system and of the relevant harmonic function which is used in the description of the magnetic field;

i) the independent groups of coefficients are discriminated and ordered according to their belonging to the categories of systematic or asystematic errors, in accordance with the symmetries of the magnetic structure and with respect to the selected reference system;

j) the independent groups of coefficients so formed are separately annulled or lowered below a maxim threshold absolute value, following a series of calculation steps, for determining the number, magnetization distribution and position characteristics of the correction elements with reference to the magnetic structure.

The above steps are generally common to many differently configured shimming methods such as for example the ones disclosed in EP1748300 or US2007229077 or US2014028311.

FIGS. 1 and 2 show examples of the grid associated to a magnetic pole in a magnet structure of an MRI system which are known in the prior art.

FIG. 1A show a distribution of correction elements, obtained through the method according to the invention, and referring to a magnet of the type as shown in FIG. 1B, in which two grids are provided each one respectively associated to one of the two opposite poles. FIG. 1B shows a magnetic structure having an annular yoke. It has two opposite poles 1, 2, which delimit a cavity 3 at the top and at the bottom thereof. The poles are associated to members 101, 201 made of a magnetized material, a magnetic field being generated therebetween, mainly in the direction of arrow Bz. The morphology of the sampling volume and the type of harmonics expansion function may be chosen in accordance with the geometry of the magnet and with the designed use thereof. Therefore, FIG. 1B shows, by way of example, both a spherical volume V and a spheroidal volume, with respect to two different orientations of the longer axis V', V".

With reference to FIGS. 1A and 1B, on the poles 1 and 2 there is provided an ideal positioning grid, consisting of a sequence of concentric rings, and of an array of radiuses, intersecting them. This defines a grid of positions in angular and radial coordinates. In FIG. 1A, the hatched elements represent the correction elements for aberrations of the magnetic field Bz are indicated as 4, 6, 6', 7. When a rotational symmetry is supposed for the imaging volume, the number of elements, the positions and the magnetization distribution of the individual correction elements may be determined for a single quadrant of the four quadrants provided Q1, Q2, Q3, Q4 and the distribution of the correction elements provided on a quadrat may be replicated on the other quadrats according to the rotational symmetry. The mathematical description of the grid related to the mathematical description of the field allows to generate an equation system, wherefrom the position on the grid and the magnetization distribution of magnetic dipoles, which form the correction elements 4, may be determined. As a rule, the calculation does not require an optimization procedure consisting in annulling the groups of systematic coefficients, but the number, position and magnetization distribution parameters of the correction elements are determined by lowering said groups of actual coefficients below a predetermined maximum threshold.

In FIG. 2, a further exemplary embodiment of the distribution of magnetic field correction elements 3 on a tray superimposed to a magnetic pole is shown. The magnetic correction elements are magnetic dipoles having a predetermined magnetic charge. Each magnetic correction element is placed in a certain position on the tray, so that the combined magnetic field of the magnet and of each of the correction elements is a magnetic field for which inhomogeneities are cancelled or deduced below a threshold of few ppm.

AS it will be apparent from the disclosures of the documents cited above carrying out a shimming operation requires both a high specialization in physics and mathematics and a good skills in carrying out manual operations requesting very fine adjustments such as the positioning of the correction elements on the right place of the grid.

Currently the operations are carried out by human persons and the time requested for executing the shimming task are normally quite long and complex.

As it will appear evident from the above cited documents, the inhomogeneities of the magnetic field have two different origins: Inhomogeneities are introduced by the shape of the magnetic structure and this kind of inhomogeneities or aberrations are considered being of the systematic kind depending on constructive parameters of the magnet structure which is present in every identical magnetic structure; Nonsystematic aberrations or inhomogeneities which are due to the tolerances in the dimensional and relative positioning of the constructive elements forming the magnet structure as well as to tolerances of the material used in relation to the magnetic behavior of the said material. The compensation of this kind of inhomogeneities or aberrations cannot be easily predicted since it is specific and may be different for every different magnet structure. ON the other hand since each magnet needs to be subjected to a shimming operation there is a very great number of cases and the corresponding data which relates a certain initial magnetic field generated by a magnet which has not yet been subjected to the shimming to a certain distribution of correction elements on the positioning grid for such elements.

Taking into account the symmetries of the field and of the magnetic structure allows as disclosed above in a specific example to reduce the number of variables to process since the grid and the number of correction elements is limited to only one part of the complete grid.

According to the shimming process known from the state of the art, the person carrying out the shimming process operates with the aid of a computer program which at each iteration step indicates to the person the correction elements to be added on the grid and their position. As it may appear clear for the skilled persons there might exist more than one solution suggested as the result of the execution of a processing step according to the above features which solutions provides for an identical correction in relation to minimization of the inhomogeneity or in relation to minimization of the differences between the computed and desired magnetic field and the effective magnetic field generated by the said correction. Currently the person carrying out the shimming selects one of the solutions suggested by the program basing the choice on its personal skills and ability. The result is that the quality of the shimming and also the duration and efforts needed to carry out the shimming process itself are user dependent and that for differently skilled or experienced user different solution are obtained so that no exact repetition of the process is ensured.

Since the choice between the alternatives furnished by the program depends mainly on the personal skills it appears very difficult to generate an objective protocol for carrying out the choice based on well-defined rules guiding the person carrying out the shimming and offering repeatable outcomes independently from the skills of the person in charge of the shimming.

Many conditions must be considered for choosing the set of correction elements representing the best solution or intermediate solution of the optimization process. Some examples are disclosed in the following list containing no exhaustive examples: correction elements determined in a following iteration step may have same or very close positions on the grid with correction elements determined in one of the previous repetition steps, determining a concentration of magnetic charge in certain positions; near or coinciding correction elements may have same polarity so that they cannot be placed in the determined position due to their mutual repulsion; near or coinciding correction elements may have different strength of the magnetic field but opposed polarity so that these correction elements may be replaced by one correction element; the correction elements on the grid which maintains the total charge of the set of correction elements is preferred to the solutions which increase more the total charge; the correction elements on the grid which provides a more homogeneous distribution of the charge on the grid are preferred to other set of correction elements which generate non homogeneous distributions of the charge on the grid.

SUMMARY

It is an object of the present invention to provide a method for carrying out the shimming of a magnet of an MRI apparatus in a more simple and less time consuming way allowing to obtain at least the same precision in suppressing or reducing the inhomogeneities of the magnetic field as for the current methods but in a fraction of the time currently needed.

It is a further object of the present invention to allow to overcome the necessity of carrying out the shimming without the need of providing analytical equations describing the physics of the system and trying to provide if possible a solution of the equations also in a numerical way.

It is still an object of the present invention to provide a system for carrying out the shimming method according to the present invention.

According to an embodiment, a method for shimming a magnetic field is provided comprising the following steps:
a) measuring the magnetic field and sampling it in a plurality of locations, with a predetermined space distribution within a predetermined volume of space permeated by the said magnetic field and delimited by a surface boundary and/or also on the said surface boundary;
b) defining a grid for positioning the correction elements, depending on the magnet structure and on the correlation thereof with the field structure;
c) calculating the position and magnitude parameters of one or more correction elements to obtain predetermined target values of the field characteristics, in which the step c) is carried out by a machine learning algorithm or combinations thereof, which algorithm has been trained by a database of known cases in which each record links a certain initial magnetic field of a magnetic structure to the pattern of correction elements on a positioning grid for these correction elements in the magnet structure, thereby delivering as an output a pattern of correction elements on the positioning grid which contributions to the magnetic field of the magnet structure generate a magnetic field which at least best approximates or meets the said predetermined target values of the field characteristics.

According to an embodiment the said target values of the characteristics of the magnetic field being the inhomogeneity of the magnetic field in the said volume of space and/or on the surface boundary and/or the configuration of the magnetic field in relation to a theoretically defined nominal or target magnetic field.

Many different alternative approaches may be used for carrying out the above steps.

The machine learning algorithm is trained by a training database comprising records relating to the following data of each one of a population of known cases:

the measured data of the magnetic field in its initial non optimized, i.e. shimmed condition at measuring points distributed according to a predetermined distribution in a predetermined volume of space;

optionally the size and/or the position in relation to the magnet structure and/or the shape of the boundary surface of the said volume of space;

the chosen kind of grid for positioning the correction elements of the magnetic field; the correction elements determined by the successfully executed process of optimization or shimming, each one of the said correction elements being characterized by one or more of the following parameters: position on the grid, magnetic charge, i.e. strength of the magnetic field generated by the correction elements, polarity of the magnetic field.

According to a first embodiment the machine learning algorithm is set as to predict the distribution of correction elements on a grid for positioning the correction elements in a magnets structure which minimizes the difference between the theoretically wanted magnetic field and the measured magnetic field.

According to a first embodiment the machine learning algorithm is set as to predict the distribution of correction elements on a grid for positioning the correction elements in a magnet structure which minimizes the inhomogeneity of the magnetic field in the predetermined volume of space as defined above.

In relation to the present application and in the claims the term shimming, shims, shimmed comprises the meaning of reducing the inhomogeneity below a maximum inhomogeneity threshold or cancelling the inhomogeneity of the field in a volume of space permeated by the said field and also the meaning of minimizing the differences between a theoretically configured target field in the said predetermined space volume and the effective magnetic field generated by the structure and the correction elements.

The volume of space is a volume which is delimited by an ideal boundary surface and which has a predetermined size, a predetermined shape of the boundary surface and a predetermined relative position in respect to the magnetic structure generating it.

According to a further embodiment the machine learning algorithm is a predictive algorithm trained on the above defined database of known cases and which uses as an input the sample data of the magnetic field effectively measured and as an output the pattern of the correction elements on the grid.

According to a further embodiment the machine learning algorithm is an evolutionary algorithm such as a genetic algorithm in which the distribution of correction elements on a certain grid which best cancels or reduces the inhomogeneities is calculated by combining the known distributions in a database of known cases in order to generate a distribution of correction elements minimizing the differences between measured field and target field in relation to the values of the predetermined target field characteristics such as for example the inhomogeneities, the evolutionary process for combining the known distributions in order to generate the next generations is guided by the measured values of the said field characteristics, i.e. the inhomogeneity pattern of the magnetic field corrected through the distribution of correction elements resulting from the theoretical calculation of the magnetic field at predetermined measuring positions on a grid of measuring points defined in a volume permeated by the magnetic field.

Many different kinds of machine learning or artificial intelligence algorithm can be used for carrying out the method according to the present invention.

According to still a further variant embodiment a particular kind of predictive algorithm can be used consisting in a neural network in which the nodes represents the grid of the correction elements and the matrix of the weights which comprises the weight applied to each activation function of each node is the output determining the magnetic field of the correction element at a certain position of the grid. Such kind of algorithm is known and an example thereof is described in document EP1656632.

Also combinations of predictive or classification algorithm and genetic algorithm may be used.

According to still a further embodiment the calculation of the distribution of correction elements of a certain predetermined positioning grid can be combined with an optimized training process which provides for the selection of specific records form the database of known cases which allows to generate a training database providing the best training of the machine learning algorithm.

According to still a further embodiment, the above optimized training process may provide also a step for reducing the number of correction elements on a grid by individuating the correction elements of the distribution of correction elements which can be substituted by a less number of correction elements at different positions and having a different magnetic charge.

The above two embodiments can be carried out by using a database optimization technique according to the one disclosed in document WO2004063831.

According to still a further embodiment the above method according to one or more of the disclosed embodiments, can be carried out by individuating a symmetry of the magnet structure and/or of the grid and dividing the magnet structure/and or the grid and/or the magnetic field in sectors according to the said symmetry;

applying the method steps according to one or more of the above disclosed embodiments only to one first of the said sectors;

obtaining the one or more correction elements and their positions on the grid within the said one first sector and;

projecting the said one or more correction elements and their positions on the grid form the said first one sector to each of the further sectors according to the symmetry.

Carrying out the above steps for each repetition step of the method when one or more of such repetition steps are provided According to a further embodiment which can be provided in combination with one or more of the above disclosed embodiments or combination of features, the process is carried out iteratively, i.e. is repeated several times, particularly repeating the steps a and c and in which at each repetition the magnetic field measured is the field generated by the magnetic structure in combination with the magnetic field generated by the correction elements determined and placed as the result of the previous repetitions.

The sequence of repetitions may be terminated according to one criteria or to a combination of criteria of the following list: the measured inhomogeneity of the shimmed magnetic field is below a predetermined maximum inhomogeneity threshold, the number of repetitions has reached a maximum number of repetitions, the rate of reduction of the inhomogeneity at each step falls below a minimum rate value, i.e. each new repetition does not provide for a relevant further reduction of the inhomogeneity in relation to the previous ones and/or the difference of the effectively generated magnetic field in relation to a desired theoretically determined target field are below a certain maximum value of a parameter or a combination of parameters describing the said difference between the magnetic fields.

Further criteria may be also used which are considered relevant by the skilled person either as an alternative to the above disclosed ones or in combination with one or more of the previous ones.

According to a further embodiment, the method according to one or more of the above embodiments or combination of features may be combined with at least one or more shimming steps carried out according to the process known at the state of the art and disclosed above.

A variant embodiment of the above more general embodiment provides for using as at least one first iteration step of the method comprising the steps of a) measuring the magnetic field and sampling it in a plurality of locations, with a predetermined space distribution in a volume of space permeated by the said magnetic field and delimited by a surface boundary and/or also on the said surface boundary;

b) defining a grid for positioning the correction elements, depending on the geometric features of the magnet structure and on the correlation thereof with the field structure;

c) calculating the position and magnitude parameters of one or more correction elements to obtain predetermined target values of the field characteristics, in which the step c) is carried out by a machine learning algorithm or combinations thereof, which algorithm has been trained by a database of known cases in which each record links a certain initial magnetic field of a magnetic structure to the pattern of correction elements on a positioning grid for these correction elements in the magnet structure, thereby delivering as an output a pattern of correction elements on the positioning grid which contributions to the magnetic field of the magnet structure generate a magnetic field which at least best approximates or meets the said predetermined target values of the field characteristics, at least a further step being provided consisting in carrying out one further processing step which comprises the following steps:

i) measuring the magnetic field generated by the magnets and by the contributions to the magnetic field of the magnet due to the correction elements calculated in steps a) to c) and sampling it in a plurality of locations, with a predetermined space distribution in the said space volume of step a);

ii) determining the values of the characteristics i.e. of target parameters describing the characteristics of the magnetic field generated in the said space volume;

iii) calculating the position and the magnetic field magnitude of said one or more correction elements to obtain the magnetic field of the magnetic structure in combination with the contribution of the said one or more correction elements positioned on the said grid which minimizes the differences of the measured values of the characteristics of the said generated magnetic field with the said target values of the characteristics of the magnetic field;

iv) positioning the correction elements determined at step iii) on the grid;

v) measuring the values of the characteristics of the magnetic field generated by the magnet structure and the correction elements resulting from the previous steps a) to c) and i) to iv);

vi) determining if the said measured values of the characteristics of the generated magnetic field at step v) minimizes the differences of the measured values of the characteristics of the said generated magnetic field with the said target values of the characteristics of the magnetic field;

vii) repeating the process according to step a) to c) or the process according to step i) to vi) until the said difference is below the said maximum threshold or the target values are met by the measured ones;

viii) ending the process if the above condition of step vii) is met.

Further iteration/repetition steps may be provided which can be carried out according to one or more of the following alternatives:

repeating one after the other the sequence of steps a) to c) and followed by the sequence of the steps i) to viii) applied to the magnetic field generated by the magnet and by the correction elements determined in the previous iteration step;

repeating one or more times the processing step comprising the steps a) to c);

repeating one or more times the processing step comprising the steps i) to viii), for each of the same alternatives the iteration being carried out on the magnetic field generated by the magnet and by the correction elements determined in the previous iteration step.

The above embodiment may be combined with one or more of the above disclosed alternatives or embodiments or combination of features regarding the end of the repetition of the shimming method and/or relating to providing training an testing optimization methods of the machine learning algorithm and/or using in combination or in a sequence of different processing steps two or more different kinds of machine learning algorithms. The machine learning algorithm may for example be one according to one or more of the kind of algorithms disclosed above or a combination thereof.

According to a further embodiment, the machine learning algorithm can be used in al alterative manner for helping the person carrying out the shimming process according to the traditional way disclosed above, to choose between the different alternatives that the program helping the shimming process suggests to the user as a result of a processing step.

According to the above an embodiment of the method for carrying out the shimming of a magnet comprises the following steps:

i) measuring the magnetic field generated by the magnets and by the contributions to the magnetic field of the magnet due to the correction elements calculated in steps a) to c) and sampling it in a plurality of locations, with a predetermined space distribution in the said space volume of step a);

ii) determining the values of the characteristics of the magnetic field generated in the said space volume;

iii) calculating the position and the magnetic field magnitude of said one or more correction elements to obtain the magnetic field of the magnetic structure in combination with the contribution of the said one or more correction elements positioned on the said grid which minimizes the differences of the measured values of the characteristics of the said generated magnetic field with the said target values of the characteristics of the magnetic field;

iv) in presence of one or more different alternative solutions consisting each one of a different set of correction elements in relation to the strength of the magnetic field, the position and or the polarity of the magnetic field and or the number of the said correction element, determining a best set of correction elements by using a machine learning algorithm trained with a database recording the measured magnetic field form which the processing step is started and/or the measured values of the characteristics of the field and/or the corresponding target values and/or the obtained differences between measure values and target values of the magnetic field and/or the set of correction elements and corresponding positions chosen in executing shimming process of known cases;

v) executing the previous steps vi) to viii) using the set of correction elements and of the corresponding position determined by the machine learning algorithm.

In relation to the above disclosed embodiment, the machine learning algorithm can be a classification algorithm.

Still according to a further embodiment, a machine learning algorithm can be provided for carrying out the determination of the set of correction elements based on an optimization algorithm, such as the minimization of a cost function expressing the difference between predefined target values of the characteristics of the field and the corresponding measured values.

Different cost functions and or optimization algorithm are known at the state of the art and the choice of one specific optimization algorithm is within the ordinary skills of the expert in the art.

The optimization algorithm can be also a machine learning algorithm such as a genetic algorithm.

The invention is also directed to a system for carrying out the shimming of magnetic structures, particularly of MRI apparatuses.

According to an embodiment, the system comprises:

a sensor unit for measuring the magnetic field;

a supporting structure of the said sensor unit which can be displaced along three spatial coordinates for positioning the sensor unit at different spatial positions;

a data collection unit receiving the magnetic field measures of the sensor at each spatial position and comprising a memory for saving the data pairs relating to magnetic field strength and spatial position at which the said magnetic field strength has been measured;

a processing unit comprising a memory in which a machine learning algorithm model is saved and a working memory in which said machine learning model is loaded for execution;

a data output consisting in a display and or a printer of a list of positioning coordinates on a positioning grid of one or more magnetic correction elements and the corresponding magnetic charge of the correction elements and/or of an image of a positioning grid of the correction elements on which grid the correction elements are positioned according to the calculated distribution and are combined with the visual indication of the corresponding magnetic charge.

According to an embodiment an automatic pic and place device for the correction elements is provided, such as a robotic arm, which is provided in combination with a magazine of differently magnetically charged correction elements and a control unit of the said robotic arm which controls the pic and place operations of the correction elements on the positioning grid according to the compute distribution and which control unit receives the coordinates of the position of each correction element and the information of which kind of correction element is to be put in place at a certain coordinate on the grid from the processing unit and generates the commands to drive the robotic arm.

DETAILED DESCRIPTION OF THE PREFERRED EMBODIMENTS

Figures 3, 4:
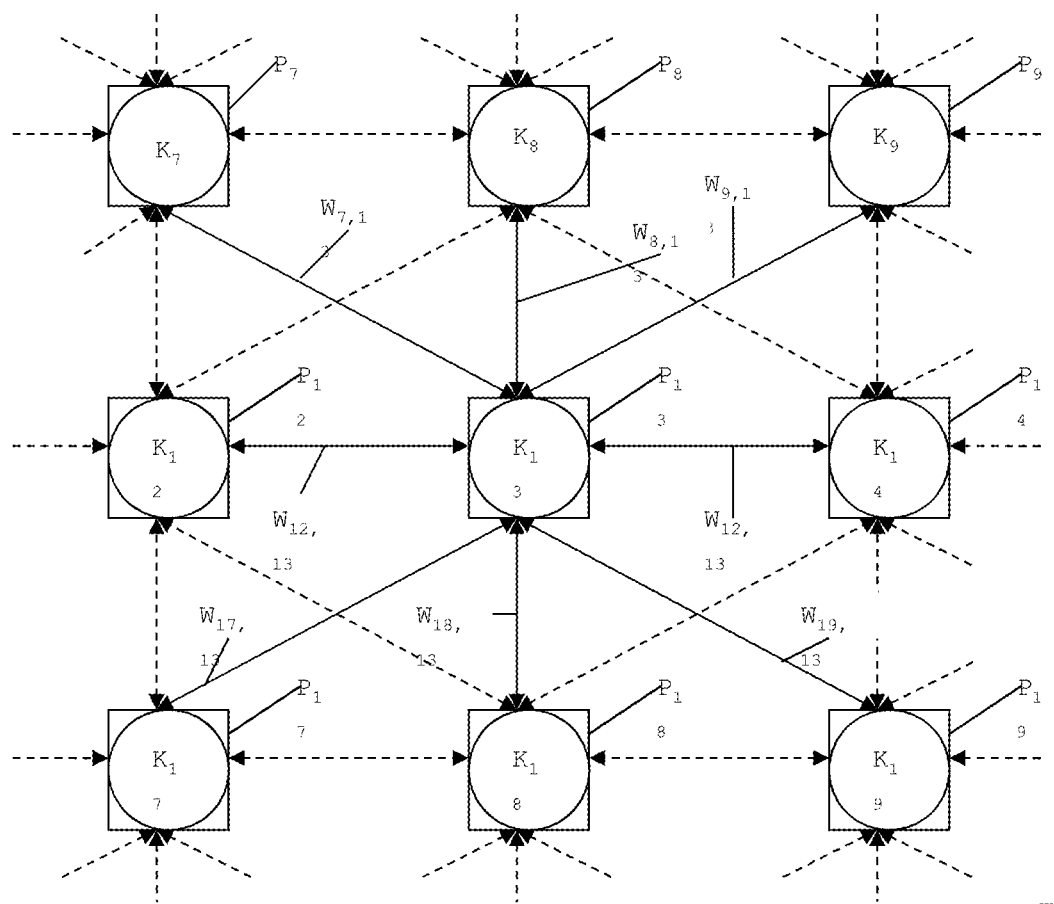
FIG. 3 is a block diagram of a system according to an embodiment of the present disclosure.
FIGS. 4 and 5 show an example of an embodiment of a neural network which is particularly suited for carrying out the method according to the present disclosure.

The algorithm according to FIGS. 3 and 4 is an algorithm for recognizing relationships between data of a database, the data being of the kind where the relative position of the variable in an array of variables or in a distribution of variables in a N-dimensional space, particularly a two or three dimensional space is a relevant feature of the data record and where the data can be represented as an array of cells or points, each point being univocally related to a value of a variable of the corresponding record in a database and having a univocally defined position in the array relatively to the cells or points of the other variables. To each data variable of the data record being associated a correction element with a magnetic charge so that each cell or point in the array of cells of points representing a correction element and is considered to be a unit or a knot of an Artificial Neural Network;

each unit or knot formed by a cell or point of the database being successively defined as a target unit or knot and connections being defined between each target unit or knot at least to each one of the rest of the units or knots formed by the rest of cells or points of the database which are at least of gradient 1 relatively to the corresponding target unit or knot;

the array of knots corresponds to the positions of the correction elements on the grid;

a new output value of each unit or knot of the database successively defined as target unit or knot being calculated by means of the set of learning rules or functions or the set of activation rules or functions of the artificial neural network or by means of the combination of both the set of learning rules or functions and the set of activation rules or functions of the artificial neural network as a function of the actual output of the units or knots connected to the target unit or knot and of the actual output of the said target unit or knot;

The actual outputs of each unit or knot being defined as the value of the variable or as the values of the variables associated to each data record represented by a cell or a point considered as a unit or knot of the artificial neural network;

And the new output of the target unit or knot is considered as the new value of the variable or of the variables associated to the cell or point of the array of data corresponding to the target unit or knot;

By carrying out the said steps for computing a new output of a target unit or knot for at least part or for each cell or point of the array a new array is computed where the value of each cell or point has a new value of the at least one variable or new values for the variables as a result of a first computation cycle of the artificial neural network according to the above steps.

The learning rules or functions or the set of activation rules or functions of the artificial neural network are generated as a function of the initial non-shimmed field directly or as a cost function which is to be minimized, such as for example a cost function expressing a parameter valuating the inhomogeneity.

The learning phase starts with a fixed predetermined value of the weights for each connection while the starting value of the unit or knot is modified according to a predetermined function which is also function of the weights and of the value of the surrounding knots or units and therefore to the data records which corresponds to cells or points in the array directly surrounding the cell or point representing a certain unit or knot of the artificial neural network.

In the present invention the weights or the learning functions could be generated as a function of the not-shimmed magnetic field univocally related to the array of values for the charge and the position of the correction elements.

A new array is thus constructed in which each variable has maintained the position with respect to the other variables in the representation of the variables as cells or points in an array while each variable has changed its value as a function of its original value and of the original values of the variables relative to the surrounding points in the array.

Referring now to FIG. 3, a two-dimensional array of values corresponding each one to the magnetic charge of a correction element is schematized by an array of square cells which are identified by Pi, where i are elements of Natural Numbers. The central nine square cells P7, P8, P9, P12, P13, P14, and P17, P18, P19, are drawn with continuous lines while the surrounding further cells are drawn with discontinuous lines for representing the fact that the array can be larger than the one represented.

Each cell of the array is a cell for a correction element and the corresponding magnetic charge at the position of the grid for positioning the correction elements corresponding to the cell position, the relative position of each cell of a variable to the other cells of variables being a relevant feature of the corresponding variable. Each variable associated to each cell has a value Ui, where i is element of the natural numbers and where the said value can be a parametric value of only a variable or a vector comprising each data record a set of different variables.

FIG. 4 tries to schematically picture the step used by the above algorithm which provides for treating the data records of the two-dimensional array by transforming the two-dimensional array of cells in an artificial neural network. The squares represent the relation to the original cells Pi of FIG. 4, while the enclosed circle Ki represents the transformation or association of each cell Pi to a unit or knot Ki of an artificial neural network.

The connection arrows wij represents the connections between the units or knots Ki and Kj of the artificial neural network. FIG. 4 is related only to the nine central cells of FIG. 3 and the connection arrows are continuous for the central cell P13, which is the cell corresponding to the actual target data record, while the discontinuous arrows are related to connection to peripheral cells which are obviously used by the present algorithm and the mechanism of which derives identically from the description of the way of working of the present algorithm as described with reference to the sole central cell P13. Also the fact that the arrows are provided at both the ends of the connections represents the fact that by describing the way of working with reference of a peripheral cell to the center cell P13, this actual center cell P13 will become a peripheral cell of another cell which will be the center cell.

So by applying the algorithm according to the present invention to the array of cells the said algorithm sweeps the array cell by cell each time identifying a cell as the momentary central cell and the corresponding peripheral cells and the associated connections between the central cell and the peripheral cells and when the computation has been carried out for a certain cell momentary defined as a central cell, an adjacent cell is defined as the new central cell and new peripheral cells of this new central cells are identified with the corresponding connections, the computation being carried out this time for this new central cell and the new peripheral cells with the corresponding connections and so on. This mechanism is repeated until each cell of the array has been subjected to computation by the algorithm, thus ending a first computation cycle of the artificial neural network. The following cycles are identical with the difference that they are applied to the array of cells which has been previously treated by the algorithm.

As already explained computation may be carried out by only considering a set of learning rules or functions which computes new outputs of the actual center cell Pi, by means of defining new weights wij of the connections as a function of the outputs of the centre cell and of the surrounding cells, this means of the values of the variable or of the variables of the data record corresponding to this cells. The new output of the center cell will be then set as the new value or the new values of the variable or of the variables of the center cell and will be a function of the outputs of the surrounding cells, this means of the values of the variable or of the variables of the data records corresponding to the said surrounding cells and of the new weights computed by the algorithm.

According to a practical example, a database of known cases is generated each case being univocally associated to a record comprising as variables, values of the non shimmed magnetic field measured at a certain number (s) of different sample points of a predetermined grid of sample points. In an example the grid of sample points can be equally spaced apart points distributed along a surface enclosing a space permeated by the magnetic field to be shimmed and at which points the intensity of the magnetic field is measured. The surface may be of any shape as for example a sphere or a semi sphere or an ellipsoid or the surface of a polyhedron.

The magnetic field being univocally characterized by the values of the intensity MF of the magnetic field at the different points s(coordinate) which points are univocally identified by a position coordinates in a predefined reference system. The measured values being identified by MF(s (coordinate)).

Furthermore each data record comprises the variables relating to the magnetic field intensity of a correction element Cr on a predetermined positioning grid of the said correction element such as a two dimensional grid according to the previous examples. Each correction element having a value indicating a certain magnetic charge related to a position on the grid which is defined by position coordinates defined by the said grid.

The grid can be a squared grid or a circular grid as the one shown in the previous examples and depending on the geometry of the grid the better fitting coordinate system can be chosen, such as a cartesian or a polar coordinate system. Thus each correction element is univocally identified by it magnetic charge and by its position of the grid.

The number of correction elements and their distribution on the grid is the one obtained by a shimming process of the magnetic field carried out with traditional methods.

According to a further example each record related to each magnetic field and to the associated distribution of correction elements may comprise also a fitness value of the shimming for example a value of the variance of the magnetic field intensity in space or the maximum deviation of the magnetic field intensity relatively to the target value.

The said database codes each record by the measured samples of the magnetic field intensity before being shimmed, the distribution of correction elements on the grid and their magnetic charge and optionally the fitness of the obtained shimming by means of a variance value of the shimmed magnetic field or the peak value of the magnetic field intensity deviation relatively to the target value of the said intensity.

The neural network suggested by the embodiment of FIGS. 3 and 4 is a representation of a grid for positioning correction elements for shimming a magnetic field having a squares geometry limited to a grid having 5×5 discrete positioning points for a correction element. Pi value represents the i-th position coordinate in the grid and Ui represents the measured samples of the non shimmed magnetic field and the corresponding magnetic charge of a correction element at the i-th positioning point on the grid used for shimming the said magnetic field and optionally the fitness value of the shimming according to a fitness function described above.

According to the above disclosed method step in relation to FIG. 4 the above geometry is reproduced in a neural network architecture in which each position point and each correction element at a corresponding positioning point of the grid forms a knot Ki of the neural network. The said architecture is known in the art as a so called "circuital ANN" in which each unit or node is similar to any other. A typical kind of said ANN is known as a so called Constraints Satisfaction Neural Network (CS) (see for example Massimo Buscema, Substance Use & Misuse, 33(2), 389-408; Stanley Einstein Institute for the Study of Drug Misuse, Inc., Jerusalem, Israel; 1998)

In the following some examples of rules for updating the output of the knots of the artificial neural network and thus the values of the corresponding data records and for updating the weights of the connections are given. This rules which are functions are defined by a name which will help in simplifying the identification in the description of a particular rule.

A set of rule I is generally indicated as CS, i.e. Constraint Satisfaction which can be developed in different variants disclosed hereinafter:

I.1. so called CS $\overline{XOR}$

| Center | Neighbors | State |
| --- | --- | --- |
| 1 | 1 | 1 |
| 1 | 0 | 0 |
| 0 | 1 | 0 |
| 0 | 0 | 1 |

Initialization: $u_i = input_i$ $$Net_i = \left(\sum_j u_j w_{ij}\right) \cdot \alpha$$

$$\Delta_i = Net_i \cdot (1 - u_i) \cdot \alpha \quad Net_i > 0$$

$$\Delta_i = Net_i \cdot u_i \cdot \alpha \quad Net_i < 0$$

$$u_i^{[n+1]} = u_i^{[n]} + \Delta_i$$

where $U_i$ is the output of the central knot $K_i$ $U_i$ is also defined as input of the i-th unit in combination with the initialization step. This definition wants to stress out that at the first step of carrying out the neural network the i-th unit has as an output value the value of the corresponding correction element. Obviously in the starting step of the neural network this value has to be attributed to the i-th unit and is considered as an input. In the following computational cycles the value of each unit is changed by the algorithm and when a certain number of repetition has been carried out the value of the i-th unit corresponds or is correlated to the value of the i-th pixel in the output image.

$U_j$ are the outputs of the surrounding knots $K_j$ $Net_i$ is the net input of the central Knot $K_i$ computed as a function of the outputs $U_j$ of the surrounding knots $K_j$ and the weights $w_{ij}$ of the connections of the the surrounding knots $K_j$ to the central Knot $K_i$.

n is the number of cycle $\Delta_i$ is the update value of the output $U_i$ of the central knot $K_i$ for computing the new output value for the next cycle as a function of Net input $Net_i$ and the actual output $U_i$ of the central knot $K_i$ $\alpha$ is a constant.

I.2 so Called CS AND

| Center | Neighbors | State |
|--------|-----------|-------|
| 1 | 1 | 1 |
| 1 | 0 | 0 |
| 0 | 1 | 0 |
| 0 | 0 | 0 |

Initialization: $u_i = input_i$ $$Net_i = \left(\sum_j u_j w_{ij}\right) \cdot \alpha$$

$$\Delta_i = Net_i \cdot (1 - u_i) \cdot \alpha \cdot \left(\sigma^2 - \frac{1}{2}\right) \quad Net_i > 0$$

$$\Delta_i = Net_i \cdot u_i \cdot \alpha \cdot \left(\sigma^2 - \frac{1}{2}\right) \quad Net_i < 0$$

$$u_i^{[n+1]} = u_i^{[n]} + \Delta_i$$

$$\overline{u} = \frac{\sum_{k \neq i}^N u_k}{N}; \quad \sigma^2 = \frac{\sum_{k \neq i}^N (\overline{u} - u_k)^2}{N}$$

in this case same definitions apply as in the previous case. The difference between this activation function and the previous lie in the fact that the function for computing $\Delta_i$ comprises a further term defined as $\sigma^2$ and this term is defined above as a function of the mean of the outputs of all knots except the central knot $K_i$ activated.

I.3 so Called CS CONTEST

| Center | Neighbors | State |
|--------|-----------|-------|
| 1 | 1 | 1 |
| 1 | 0 | 0 |
| 0 | 1 | 1 |
| 0 | 0 | 0 |

Initialization: $u_i = input_i$ $$Net_i = \left(\sum_j u_j w_{ij}\right) \cdot \alpha$$

$$\Delta_i = Net_i \cdot (1 - u_i) \cdot \alpha \cdot \left(\sigma^2 - \frac{1}{2}\right) \quad Net_i > 0$$

$$\Delta_i = Net_i \cdot u_i \cdot \alpha \cdot \left(\frac{1}{2} - \sigma^2\right) \quad Net_i < 0$$

$$u_i^{[n+1]} = u_i^{[n]} + \Delta_i$$

$$\overline{u} = \frac{\sum_{k \neq i}^N u_k}{N}; \quad \sigma^2 = \frac{\sum_{k \neq i}^N (\overline{u} - u_k)^2}{N}$$

Also here apply the same definitions as in the previous examples of activation functions (1) and (2).

The difference lie in the fact that the term $\Delta_i$ is computed in a different way for the case $Net_i < 0$.

I.4 so Called HIGH CS $\overline{XOR}$

Initialization: $u_i = input_i$ $$Net_i = \left(\sum_j u_j w_{ij} \cdot \sigma^2(w_{jk})\right) \cdot \alpha \quad k \in [1, N]; k \neq j$$

$$\Delta_i = Net_i \cdot (1 - u_i) \cdot \alpha \quad Net_i > 0$$

$$\Delta_i = Net_i \cdot u_i \cdot \alpha \quad Net_i < 0$$

$$u_i^{[n+1]} = u_i^{[n]} + \Delta_i$$

$$\overline{w_j} = \frac{\sum_{k \neq j}^N w_{j,k}}{N}; \quad \sigma^2(w_{ik}) = \frac{\sum_{k \neq j}^N (\overline{w_j} - w_{jk})^2}{N}$$

again the symbols are defined as in the previous examples of activation functions In this case the function for computing the net input $Net_i$ to the knot $K_i$ is different as in the previous cases. The function $\sigma^2$ is used in the computation of the net input. In this case the function $\sigma^2$ is applied to the weigths $w_{ij}$ of the connections as it appear clearly from the above equations.

The functions for computing the update $\Delta_i$ value of the output $U_i$ of the central knot $K_i$ are identical to the case of the first example of activation function.

I.5 so Called HIGH CS AND

Initialization: $u_i = input_i$ $$Net_i = \left(\sum_j u_j w_{ij} \cdot \sigma^2(w_{jk})\right) \cdot \alpha \quad k \in [1, N]; k \neq j$$

$$\Delta_i = Net_i \cdot (1 - u_i) \cdot \alpha \cdot \left(\sigma^2 - \frac{1}{2}\right) \quad Net_i > 0$$

$$\Delta_i = Net_i \cdot u_i \cdot \alpha \cdot \left(\sigma^2 - \frac{1}{2}\right) \quad Net_i < 0$$

$$u_i^{[n+1]} = u_i^{[n]} + \Delta_i$$

$$\overline{w_j} = \frac{\sum_{k \neq j}^N w_{j,k}}{N}; \quad \sigma^2(w_{ik}) = \frac{\sum_{k \neq j}^N (\overline{w_j} - w_{jk})^2}{N}$$

$$\overline{u} = \frac{\sum_{k \neq i}^N u_k}{N}; \quad \sigma^2 = \frac{\sum_{k \neq i}^N (\overline{u} - u_k)^2}{N}$$

As it will appear clearly from the comparison of this set of equations with the example of activation function (4) called High CS XOR and activation functions (2) called CS AND, this is a combination of the two set of activation functions.

I.6 so Called HIGH CS CONTEST

Initialization: $u_i = input_i$ $$Net_i = \left(\sum_j u_j w_{ij} \cdot \sigma^2(w_{jk})\right) \cdot \alpha \quad k \in [1, N]; k \neq j$$

$$\Delta_i = Net_i \cdot (1 - u_i) \cdot \alpha \cdot \left(\sigma^2 - \frac{1}{2}\right) \quad Net_i > 0$$

$$\Delta_i = Net_i \cdot u_i \cdot \alpha \cdot \left(\frac{1}{2} - \sigma^2\right) \quad Net_i < 0$$

$$u_i^{[n+1]} = u_i^{[n]} + \Delta_i$$

$$\overline{w_j} = \frac{\sum_{k \neq j}^N w_{j,k}}{N}; \quad \sigma^2(w_{ik}) = \frac{\sum_{k \neq j}^N (\overline{w_j} - w_{jk})^2}{N}$$

$$\overline{u} = \frac{\sum_{k \neq i}^{N} u_k}{N}; \quad \sigma^2 = \frac{\sum_{k \neq i}^{N} (\overline{u} - u_k)^2}{N}$$

Also this case represents a combination of two of the previous examples of activation functions, namely the activation functions (3) called CS CONTEST and the activation functions (4) called High CS XOR.

In order to calculate the distribution of correction elements in relation to their magnetic charge and their position on the said positioning grid which provides the shimming of a magnetic field the following steps has to be carried out.

The magnetic field to be shimmed has to be measured using the identical geometric sampling model as the one used for measuring the magnetic field of the records of the training database, namely referring to the above example an identically shaped and dimensioned closed surface and an identical grid of sampling points at which the magnetic field intensity has to be measured at for the magnetic field of the records of the training database.

Furthermore, a training step of the said Constraints Satisfaction Neural Network has to be carried out.

Different possibilities of using the training database can be used. The training step includes providing a starting weight Wij matrix for the connections between the single knots according to the above formal notation of the FIG. 4 and of the learning rules. This starting weight matrix is computed by using a back propagation Neural network of different kind, since the weight matrix must satisfy all records of the training database.

The learning algorithm for determining the starting weight matrix is a classical Back Propagation algorithm. Utilizing a Back Propagation ANN in order to learn the weights of a CS algorithm has shown itself to be a fairly efficacious method.

According to an embodiment an Auto-associative Back Propagation ANN at maximum gradient of only 2 layers is designed: a Layer of Input units and a layer of Output units. Auto-associative means that in this ANN the target vector will be the same to that of Input for every record of the training database.

Once designed, the ANN will have as a learning Pattern all Records of the training database on which it is intended to operate.

According to an embodiment, the training process provides the following algorithms:

A Forward Algorithm $$u_i = f(Net_i) = f\left(\sum_j^N u_j \cdot w_{ij} + Bias_i\right)$$

in which $$f(Net_i) = \frac{1}{1 + e^{-Net_i}} \quad \text{where } e = 2.71828182459.$$

a Backward Algorithm $$\Delta out_{i(n)} = (t_i - u_i) \cdot f'(u_i)$$

$$SelfMomentum_{ij(n)} = \Delta w_{ij(n-1)} \cdot |\Delta out_{i(n)}| \cdot \frac{1}{0.5 + |w_{ij}|}$$

where: $|w_{ij}|$=absolute value of connection on $w_{ij}$ $$\Delta w_{ij(n)} = SelfMomentum_{ij(n)} + \Delta out_{i(n)} \cdot u_j \cdot Rate_i$$

$$\Delta b_{i(n)} = Bias_{i(n-1)} \cdot |\Delta out_{i(n)}| \cdot \frac{1}{1 + |Bias_{i(n)}|} + \Delta out_{i(n)} \cdot Rate_i$$

$$Bias_{i(n+1)} = Bias_{i(n)} + \Delta b_{i(n)}$$

$$w_{ij(n+1)} = w_{ij(n)} + \Delta w_{ij(n)} \cdot u_j$$

It is useful to put the Rate on very low values (Rate <1). The learning process will be longer but more precise, and the measure's weights will be smaller.

According to an embodiment it is useful not to allow an ANN to correct the reflexive weights (i=j); the learning will be more complex and long, but the generated connections matrix will be more "refined" and then more efficacious when it is adapted as a weights matrix of the CS algorithm.

After having concluded the learning step, it is necessary to translate the weights matrix W of Back Propagation ANN into a new matrix, NewW of the CS algorithm. In this translation the reflexive weights of Back Propagation ANN will be lost, while the bias values will remain the same. Otherwise, the bidirectional connections of the Back Propagation will be reduced to symmetric connections by calculating the medium value:

1. New $w_{ii} = 0.0$

2. New $w_{ij} = \dfrac{w_{ij} + w_{ji}}{2}$

3. New $w_{ji} = $ New $w_{ij}$

4. $Bias_i = Bias_i$

At this point the weights of the es are defined.

The CS algorithm according to the present embodiment and with the starting weight matrix generated using the training database is the fed with the data od the measured magnetic field to be shimmed and the rules according to one of the above mentioned examples I.1 to I.6, is started in order to adjust the weights of the starting matrix. The result is an output record in which the internal status of each knot Ui is updated by providing a distribution of correction elements which fits the input record in relation to number of correction elements, position of each magnetic correction element and associated magnetic charge.

The result may be also graphically reproduced in the image of the CS network structure by adding to the record a variable indicating the presence/absence of the correction element which is coded respectively as 1 and 0 and by providing a step reproducing the pattern of knots in which the knots associated to a value 1 (presence) are highlighted while the other are (value 0=absence) are not shown at all. Furthermore, the value of the magnetic charge and the position coordinate of the correction element can also be explicitly shown.

The output can also be in combination and or alternatively to a graphic representation in form of a list of correction elements, magnetic charge and position on the grid.

When specific robotic positioning means of the correction elements are provided, the output of the computation can also be transformed in specific instructions to the robotic position means, such as a robotic pick and place arm in order to start automatically the shimming process.

According to a variant embodiment, the algorithm for calculating the distribution of correction elements of a magnetic field on a positioning grid and the magnetic charge of each correction element needed to carry out the shimming of the magnetic field in providing an homogenous magnetic field in a certain region of space, can be carried out by using a conventional Back Propagation Neural Network having at least one input layer, one output layer and at least one hidden layer.

An identical training database can be used for training the Back Propagation algorithm. The input layer having a number of input nodes corresponding to the sample points at which the magnetic field of each record of the training database has been measured and referring to the magnetic field before shimming. The output layer comprising a number of output nodes corresponding to the positioning points defined by the positioning grid.

According to an embodiment the rules governing the algorithm are:

Forward Algorithm $$Net_j = \sum_i u_i \cdot w_{ji} + \theta_j$$

$$u_j = f(Net_j)$$

Backward Algorithm
correction calculation of the weights connected to the output:

$$\Delta out_j = (t_j - u_j) \cdot f'(u_j) \quad 1)$$

$$\Delta w_{ji} = r \cdot \Delta out_j \cdot u_i \quad 2)$$

correction calculation of the weights not connected to the output:

1) $\Delta hidden_i = f'(u_i) \cdot \sum_j \Delta out_j \cdot w_{ji}$

2) $\Delta w_{ik} = r \cdot \Delta hidden_i \cdot u_k$

Fulfillment of the corrections on weights:

$$w_{ji(n+1)} = w_{ji(n)} + \Delta w_{ji} \quad 1)$$

$$w_{ik(n+1)} = w_{ik(n)} + \Delta w_{ik} \quad 2)$$

By training the BP neural network in a supervised way imposing the input and the corresponding output of the records of the training database, namely the measured field intensity at the sample points at the input nodes and the corresponding distribution of correction elements, the weight matrix is trained.

Feeding to the input knots of the trained network the measured data of the intensity of the field at the predetermined sample points identical to the one at which the magnetic field measurements of the records of the training database has been carried out, the network will provide at the output the distribution of correction elements related to the magnetic field to be shimmed.

According to a further embodiment the machine learning algorithm which can be selected for carrying out the method according to the present invention is a so-called evolutionary algorithm as for example a genetic algorithm. Genetic Algorithms are based on Darwin's theory of natural selection. It is relatively easy to implement and there is a lot of flexibility for the setup of the algorithm so that it can be applied to a wide range of problems.

Evolutionary algorithms and among these the genetic algorithms are suited for carrying out optimization functions such as for example finding a minimum of a function. Thus the problem of finding the best distribution of correction elements having each one a certain magnetic charge and a certain position on a grid may be expressed as a loss or cost function which is a measure of the performance of a certain set of input parameters. In this case the input parameters are the number, the charge and the position of the correction elements placed on the positioning grid. In this case a possible loss or cost function could be chosen as the differences between the desired magnetic field and the effective magnetic field obtained by summing the contribution to the magnetic field of the not-shimmed magnetic structure and the contribution of each of the correction elements provided.

Another example of fitness function could be the homogeneity of the field obtained and computed as a function of the contribution to the field of the not-shimmed magnetic structure and the contribution of the correction elements provided.

The above cost, fitness or loss functions could be combined together with or substituted by other functions to be minimized such as for example the minimization of the total magnetic charge of the correction elements and/or the number of the correction elements.

In an embodiment a database of known cases is provided in which each record comprises the measured data of the magnetic field strength or flux at a predetermined number of measurement points defined according to a distribution of said measurement points in a certain volume permeated by the magnetic field. This set of magnetic field strength or flux data are univocally associated to a certain distribution of correction elements on the positioning grid and on a certain fitness value determined as a parameter measuring of the field inhomogeneity obtained as a result of the provision of the said distribution of correction elements.

The genetic algorithm is run according to the following steps:

The magnetic field of a not-shimmed magnet structure to be shimmed is measured at measurement points of a distribution of measurement point common to the one of the records in the database of known cases.

To the set of measures of the not-shimmed magnetic field each or a certain number of distributions of correction elements provided in the database id applied and the fitness value is determined using the same fitness function used for determining the fitness value of the records in the database.

The said combination of not-shimmed magnetic field measures with a distribution of correction elements represents a starting population of individuals each one being a solution of the shimming problem having a certain fitness. The gene of each solution is the distribution of correction elements combined with the measurement data set of the not-shimmed magnetic field.

Next step is a so-called parent selection. In this step the individuals pf the above defined population which have the best fitness are selected to be the parent individuals of a new generation of individuals.

The selection can be carried out according to different ways such as for example the so-called fitness-proportion selection (FPS) method or the Rank-Based Selection or the so-called Tournament Selection.

According to an embodiment the selection of the parents can be carried out by choosing the parents whose shimming was most successfully in relation to homogeneity data as measured by a field variance or a peak of the deviation of intensity relatively to the target value or to a mean value.

According to an embodiment, further criteria may be provided in combination or alternatively to the above mentioned one, such as for example, the total magnetic charge of the correction elements, the maximum correction element charge for one correction element. The distance of the correction elements one form the other relatively to certain thresholds of minimum distance between correction elements.

Once the parents have been selected, the parents undergo a process called crossover. Crossover is when two parents crossover their genes in order to create a new solution (also known as a child). This promotes exploration in the state space of the problem and potentially generates new solutions that have never been tested before.

There are several alternatives for carrying out the crossover process which are known at the state of the art. When the genes are real values one possible method is the single arithmetic crossover or the whole arithmetic crossover.

In relation to the data structure of the present problem of the definition of a distribution of correction elements and their magnetic charges also cross over techniques may be applied of the type fitted for permutation problems such as the Partially-Mapped Crossover (PMX), the Edge crossover, the Order 1 Crossover and the Cycle Crossover.

After the crossover phase the generated children population is subjected to a mutation phase. Mutation is when each gene could potentially change according to a random probability. This allows for exploitation as the children solution will not change as drastically as during the crossover phase but will still be able to explore around the neighborhood of its current solution.

Different mutation processes may be used depending on the kind of data.

In relation to the present problem of best shimming of the magnetic field, a mutation process developed for real valued solutions may be used. According to this mutation process the different genes can be chosen according to some acceptable range for that variable or by adding some noise that centers around 0 and varies according to some Gaussian distribution.

Similarly as for the cross over in relation to the present shimming problem also a mutation process may be used which is best fit for permutation problems, such as insert mutation, swap mutation, inversion mutation and scramble mutation.

According to an embodiment the crossover process and/or the mutation process can also be carried out by combining the different methods best fitted for real values and for permutation problems.

The child individuals may be characterized by data relating to a combination of the sample data od the magnetic field intensity of both parents such as the complete set of measured sample data of the magnetic field intensity is formed by part of the sample data of the two parents individuals not having identical positions of the sample points and/or by a distribution of correction elements being formed by parts of the correction elements of the distribution of correction elements of the two parent individuals which correction elements do not have identical positions on the positioning grid.

Following the generation of the children population according to the above steps, a final step is provided which is defined as survivor selection. At this step the decision is taken about which of the generated child individuals will move to the next generation. Survivors may be selected both from the population of parent and the population off child individuals. This can be done for example according known methods such for example the Age-Best Selection and the Fitness-Based Selection.

Once the new generation is selected, this whole process repeats until the algorithm converges based on some convergence criteria. After the whole algorithm runs, the best solution from all of the generations is returned.

The above generic steps of executing the genetic algorithm may be applied to the shimming problem. In the child generation phase the child individuals consisting in new distribution of correction elements on the positioning grid are obtained by crossover of the distributions of the correction elements of the parent individuals using one of the crossover methods disclosed above or a combination of these methods.

Similarly also the mutation step is carried out on the distribution of the correction elements of the child population.

Using a Fitness based approach the fitness of each parent and child distribution is calculated, for example by calculating the inhomogeneity of the magnetic field obtained after shimming the magnet structure with the corresponding distribution of correction elements. The individuals of the parent and of the child population are maintained as a parent population of a following iteration of the algorithm, while the individuals being less fit are eliminated.

The algorithm converges to a distribution of correction elements which achieves the best fitness, this means it converges to a distribution of correction elements which eliminates inhomogeneities or which widely reduces the said inhomogeneities.

According to an embodiment, the genetic algorithm can be the genetic algorithm disclosed in Genetic doping algorithm (GenD): theory and applications, Massimo Buscema, Expert Systems, May 2004, Vol. 21, No. 2 which is enclosed herein by reference.

Figure 5:
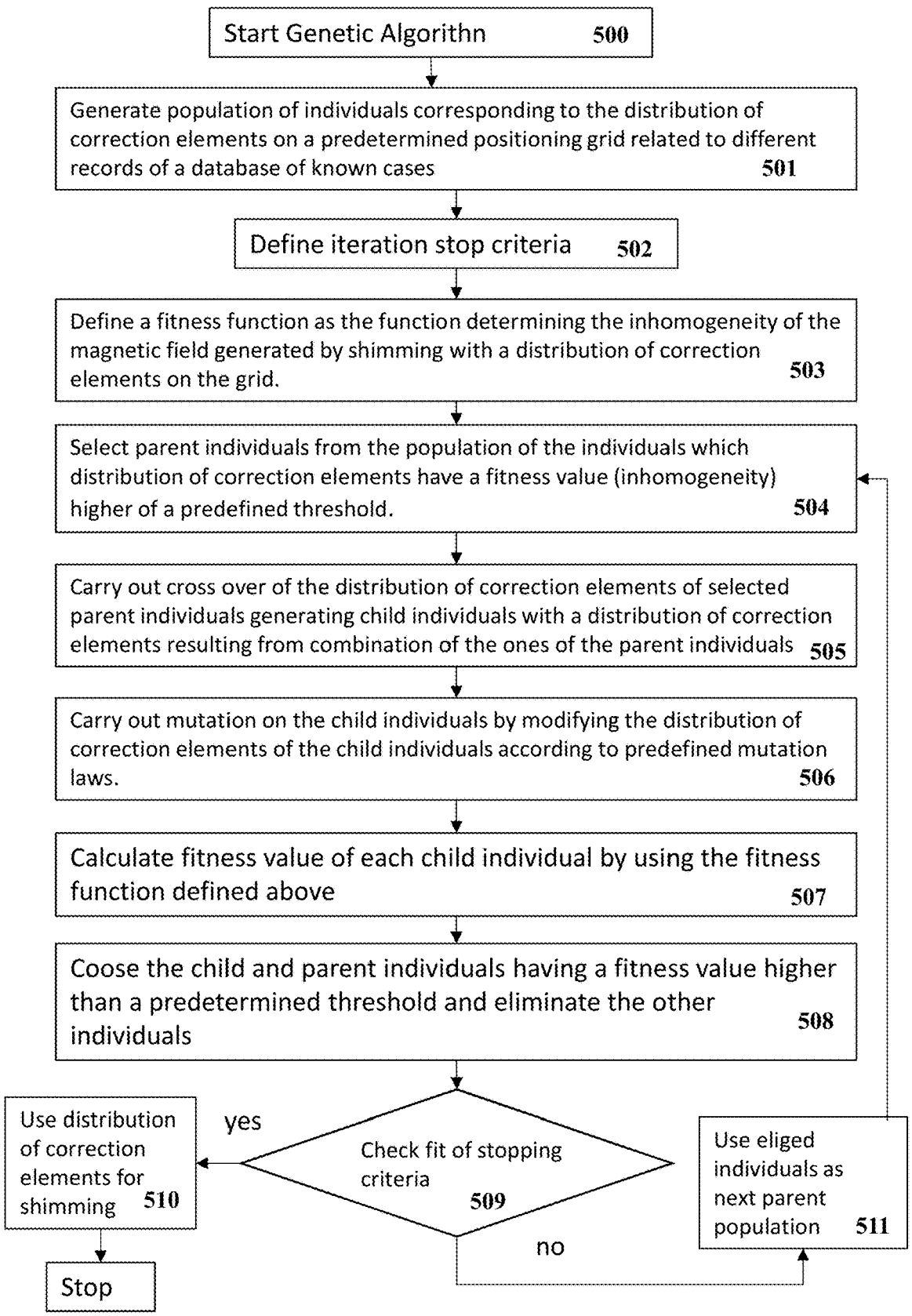

FIG. 5 shows a flow diagram of the embodiment of the present method which uses a genetic algorithm for determining the distribution of correction elements minimizing inhomogeneities of the static magnetic field.

Figure 6:
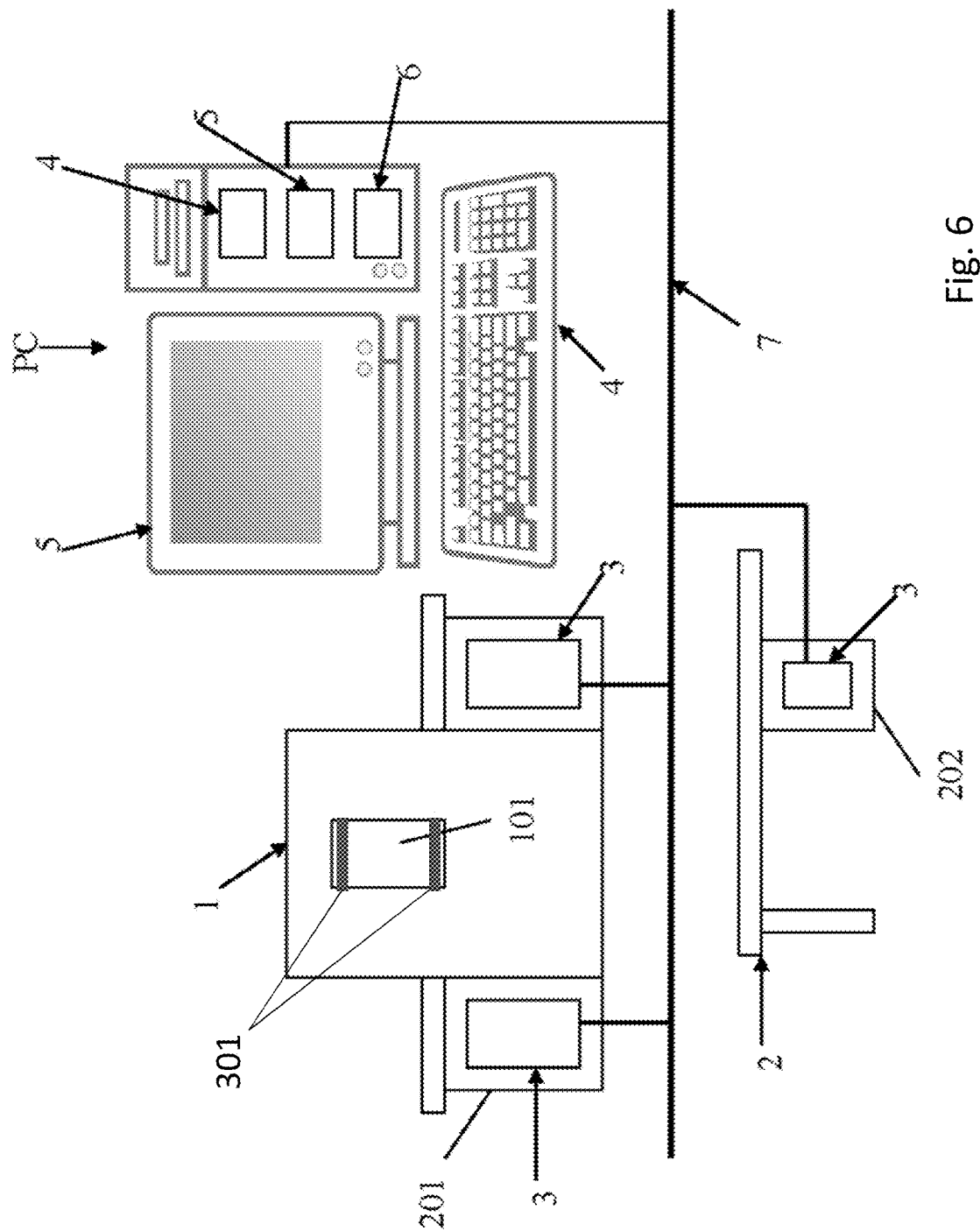
FIG. 6 shows a schematic view of an exemplary embodiment of an MRI apparatus.

With reference to FIG. 6, an embodiment of Nuclear Magnetic Resonance imaging machine suitable to be configured for carrying out the present invention comprises a signal exciting and receiving unit consisting of a magnetic unit 1. The magnetic unit includes permanent or resistive or superconducting magnets for generating a static field inside a cavity 101 which is designed to receive the patient body or a part thereof, particularly a limited anatomic region, such as a leg, an arm, the head, etc.

As is generally known, different coils are associated to the static field generating magnet, including:
  excitation coils, for exciting nuclear spins;
  magnetic gradient generating coils, for selecting the section plane along which imaging has to be performed, for encoding nuclear spins to univocally identify the signals transmitted at a predetermined space position and univocally assign the received data to a predetermined pixel of a pixel matrix which forms the displayed image;
  receiving coils, for receiving magnetic resonance echoes.

Also, other means are provided, such as temperature control sensors and/or means for heat increase or generation and means for heat dissipation, which are designed to set and maintain a predetermined operating temperature, etc.

Numeral 301 indicates diagrammatically two correction elements positioning trays provided with a positioning grid according to the examples of figures LA, 1B, and 2. The said trays 301 are placed on the magnetic poles of an MRI magnetic structure or are integrated in the pole construction, for example in chambers provided in the poles.

All the above elements are well-known and widely used in Nuclear Magnetic Resonance imaging machines of any type and size, both for total body machines, i.e. those designed to accommodate the whole patient body or a substantial part thereof, and for dedicated machines, i.e. those adapted to only accommodate specific limbs or limited parts or regions of the patient body.

The geometry of the magnetic structure, i.e. of the cavity for accommodating the body under examination or the part thereof may also be of any type, and particularly either of the open C- or U-shaped type, or consisting of two poles separated by columns, or of the annular, closed type.

FIG. 5 is a flow diagram showing the steps of an embodiment of the method according to the present invention which uses a genetic algorithm for determining the distribution of the correction elements on a positioning grid and the corresponding magnetic charges in order to shim a magnetic structure of an MRI apparatus.

Step 500 starts the process. At step 501 a population of individuals is generated in which each individual correspond to a specific distribution of correction elements on a predetermined positioning grid related to different records of a database of known cases and in which individuals is further defined by measures of the not-shimmed magnetic field of the magnet structure measured at predeterminate points on a measuring grid e ach point having a predetermined space position with reference to a reference coordinate system.

Step 502 defines the maximum number of iterations or other iteration stop criteria as disclosed above.

Step 503 provides for the definition of a fitness function. Several different fitness functions are possible. According to the present embodiment as a fitness function a function is chosen determining the inhomogeneity of the field generated by a magnetic field of the magnetic structure shimmed with a distribution of correction elements on the grid determined by the algorithm.

An alternative embodiment may provide two or more fitness functions which can be used in parallel and the results of which can be combined in order to have a more reliable fitness value estimation.

At step 504 the parent individuals are selected from the population of the individuals which distribution of correction elements have a fitness value (inhomogeneity) higher of a predefined fitness value threshold. This parent individuals are used to generate child individuals which are obtained by combining their genes. In the present example the genes of each individual consist in the distribution of correction elements on the positioning grid specific for each individual. The steps are indicated as 505 and 506 and provides for carrying out crossover and mutation of the genes of the parent and of the child individuals.

At step 507, the individuals of the child population are also characterized by a fitness value by means of the one or more fitness functions.

Based on the calculated fitness values and of the set threshold for the fitness value a selection of the individuals of the parent and of the child population is carried out at step 508. This step eliges the child and parent individuals having a fitness value higher than a minimum threshold value ad individuals of the parent population of a next iteration of the algorithm, while the other individuals having a fitness value lower than the threshold value are eliminated.

At step 509 the criteria for stopping iterations of the algorithm are checked and if these criteria are met than the distribution of correction elements according to the individuals having the highest fitness value is used for shimming, and the process is stopped as indicated by 510. If the stopping criteria are not met the process is iterated as indicated by 511.

The stopping criteria has been already disclosed above according to the one or more different alternatives.

The machine shown in FIG. 6 is a non limiting exemplary embodiment having a closed, i.e. annular magnetic structure and the cavity is only open at the two end sides transverse to the axis. C or U shaped magnets have three open sides, while other magnets are formed by only two opposite poles which limit a gantry being opened along the peripheral sides of the two poles. Also magnets comprising a limitation only on one side which is formed for example by only one pole plate, the object to be imaged being placed on one side of the said pole plate which is completely exposed to free environment.

In an embodiment a patient table or seat, which may have any construction and is denoted with numeral 2, is generally associated to the magnetic unit. Several embodiments of the patient table or seat are possible. According to one embodiment, the patient table or seat 2 may have a structure adapted to form closable housing compartments, as is schematically shown in FIG. 6. According to other embodiments the patient table may be in the form of a movable table having wheels and/or combined with elevator means and/or combined with means for changing the configuration of the table and/or a table having at least one table plate which is tiltable in order to be oriented along several directions, such as for example in the tables for carrying out weight bearings examinations.

The magnetic unit or structure, with the components listed above, is associated to control, monitoring and processing units, which have the function to control and adjust the various components of the magnetic structure and to receive and process echo signals to extract therefrom all data useful for the reconstruction thereof into an image formed by an array of light image dots, the so-called pixels, whose brightness and/or color are univocally related to the received data and whose position is related to the position, within the body part under examination, wherefrom the echo signal was transmitted.

According to an embodiment the MRI system comprises an electronic unit 3 for controlling the signal exciting and receiving devices, a unit 4 for entering commands to the signal exciting and receiving unit, a display and image processing unit 5 and a filing and storage unit 6 are associated to the magnetic unit.

In the present embodiment of FIG. 6, the unit 3 for controlling the signal exciting and receiving devices is at least partly contained in the case of the magnetic unit 1 and/or possibly also at least partly contained within the structure of the patient table 2, in one part thereof 202, for instance a support column, having the form of a switchboard.

The units for entering commands 4 to the signal exciting and receiving units, for display and image processing 5 and for filing and storage 6 are included, partly as hardware peripherals and partly as software programs, in a traditional personal computer.

The communication between the unit 3, contained in the case of the magnetic unit and/or in the structure of the patient table, with the units 4, 5, 6 of the control console provided by the personal computer is obtained by means of a communication bus denoted with numeral 7.

The communication bus may be of any type, e.g. a conventional communication bus of the Ethernet type, of the SCSI or USB type or of any other type, which allows multiplex communication among several units.

Once the type of bus to be used is selected, the implementation of interfaces with the bus 7 on the individual units 3, 4, 5, 6 is well-known in the art.

The above electronic units may be formed by specific developed boards which circuits are dedicated to carrying out the specific tasks or by generic hardware which comprises processors configured to carry out program instructions which enables the generic hardware to carry out the specific tasks.

Electronic units may be produced according to several techniques available for the construction of electronic boards and circuits.

Different programing languages and operative systems may be employed for generating the control programs providing the processors to execute the instructions for carrying out the specific tasks, such as for example Windows NT® based program languages or similar.

Figure 2:
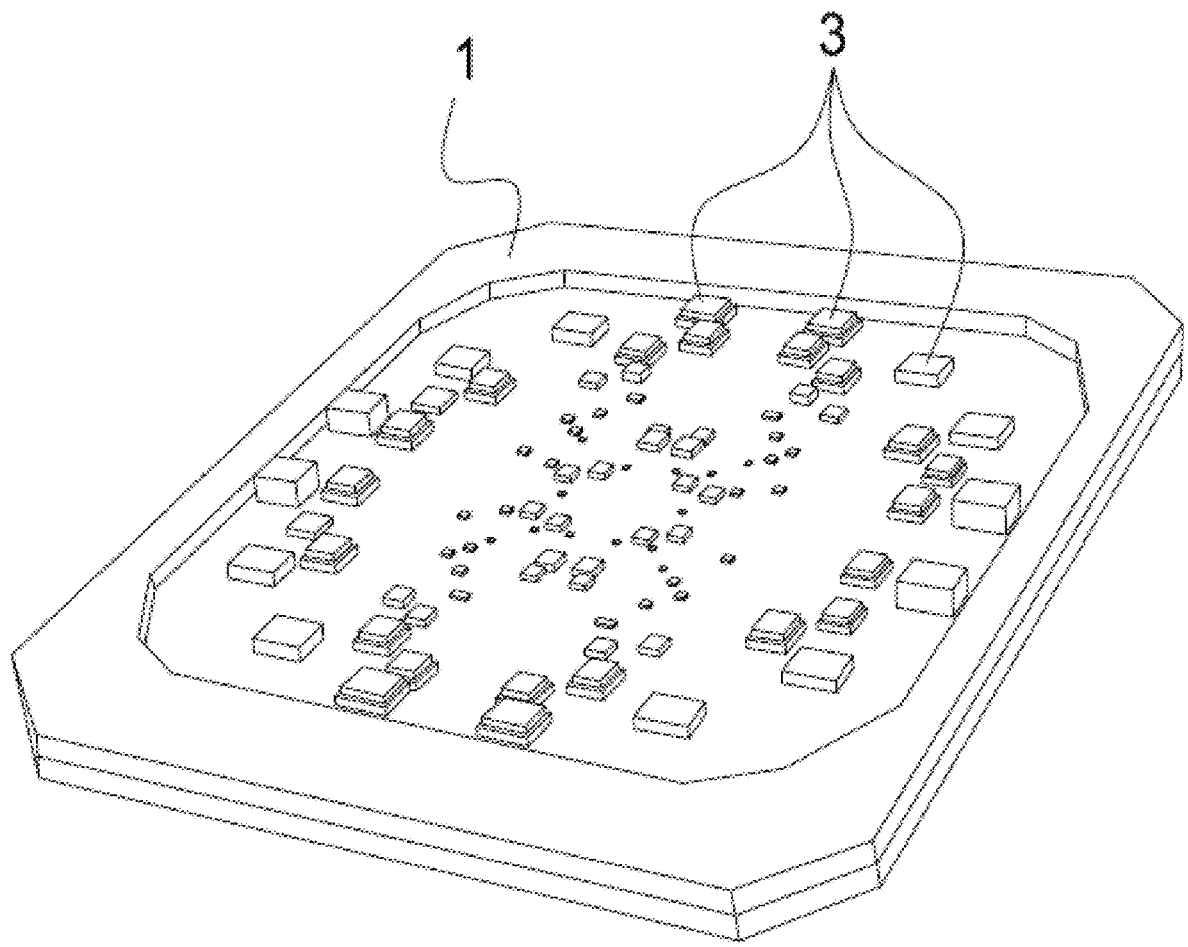
Figure 7:
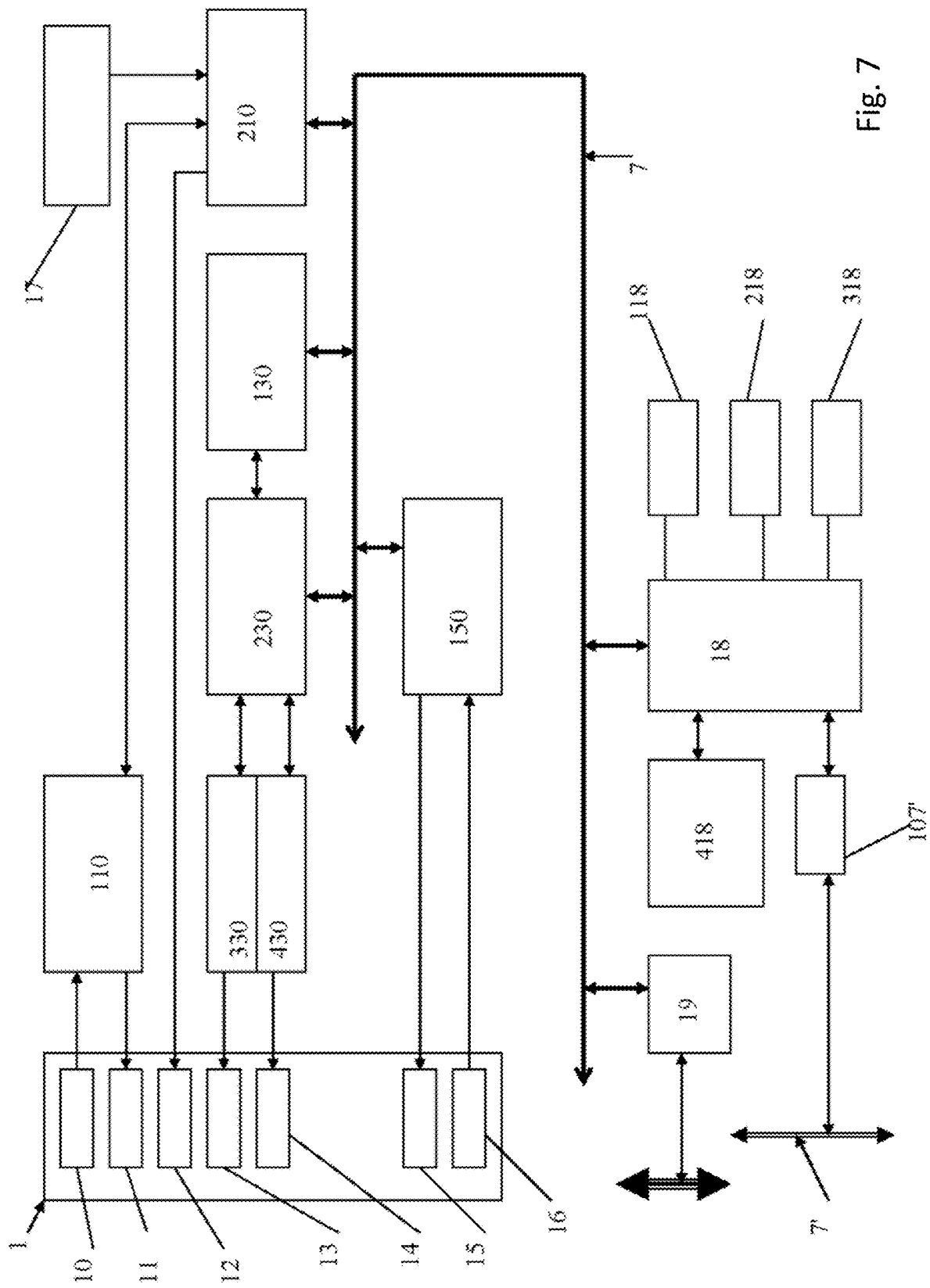
FIG. 7 shows a block diagram of a higher level embodiment of the generic embodiment of FIG. 6.

FIG. 7 shows a block diagram of a higher level embodiment of the generic embodiment of FIG. 2. In this embodiment, the magnetic unit 1 includes several components, as shown in the figure, that is, in addition to static field generating magnets, temperature sensors 10, heating and/or cooling means 11, at least one compensation coil 12, at least one transmission or excitation coil 13, one or more gradient coils 14, tuning means 15 and at least one receiving coil 16, as well as one or more magnetic field sensors 17.

The temperature sensors and the heating and/or cooling means are controlled by a temperature control unit 110 which includes means for reading the signals of the sensors 10 and means for supplying the heaters and/or coolers 11, which are controlled by a thermal control unit 210 based on the actual detected temperature and on the comparison thereof with the preset nominal values.

The thermal and magnetic control unit also controls the compensation coil 13 to correct the static magnetic field with reference to the variations induced therein by external magnetic fields and based on the actual field values detected by the magnetic field sensors 17. A supervision, pre-processing and reconstruction unit 130 controls a data capture and control unit 230 which in turn controls the amplifiers 330 and 430 for the signals provided to the transmission or excitation coil 13 and to the gradient coil/s 14 respectively. A receiver unit 150 is responsible for tuning 15 the receiving coil 16 and identifying the receiving coil 16, as well as for receiving the data collected by said receiving coil 16.

According to an embodiment these units are all contained wholly or at least partly inside the case of the magnetic unit, and/or wholly or at least partly in a closable compartment of the structure of the patient table. According to a further embodiment these units may be all or at least partly formed by a traditional PC running a program in which instructions are coded for controlling the PC processor or processors in order to carry out the functions of the said part of units.

According to an embodiment, the supervision, pre-processing and reconstruction unit 130, the control and data capture unit 230, the thermal and magnetic control unit 110 and the receiver unit 150 communicate with one another and/or with other units by means of a bus 7.

More particularly, these units communicate with the CPU 18 of a conventional personal computer, having conventional peripherals, according to the desired or required quantity and type. The display and command entry peripherals denoted with numerals 118, 218, 318, as well as a mass memory for filing and a memory for the specific image processing and display software, collectively denoted with numeral 418 are connected to the CPU 18.

According to another embodiment, the CPU 18 may also communicate 107' in turn with a local communication network 7', such as a LAN network within the hospital or an Intranet or Internet network, or a network of any other suitable type. The communication bus 7 is also connected with a modem unit 19, which allows connection to a local network and/or to other machines connected to the local network via a telephone line. This redundancy, besides allowing to communicate with local networks in other locations, is also an alternative method for connection with the local LAN network, in case of temporary communications problems of the network interfaces.

As is apparent from the above description, the communication bus is not only provided between the individual units, but is also extended inside the latter, thereby providing the greatest configuration and operation freedom as well as allowing to add functional units with new functions and/or to replace old type units with more modern units. Replacement operations, both for upgrading and repairing purposes are apparently easy. As long as signals are encoded consistently with the bus in use, any unit may be connected to the communication bus 7 and is able to exchange data and commands with the other units.

The above disclosed exemplary construction of the apparatus allows additional configurations, which might be highly advantageous in terms both of cost effectiveness and of organization and management. In fact, the connection of various units through a conventional data bus allows to control several apparatuses, even of different types, but all having the same configuration as the processing and control electronics, from a single location or from a limited number of locations.

According to a further embodiment, a system may be also provided which comprises several machines organized in groups, each having a single dedicated console in the form of a conventional computer, each conventional computer associated to each group being configured as a client computer, which accesses a server computer via a network. In this case, the server computer may contain many different programs for controlling image acquisition and/or processing and reconstruction procedures, e.g. a database of Nuclear Magnetic Resonance imaging sequences, a database of signal filtering and/or processing procedures aimed at modulating the definition and/or the contrast and/or the signal-to-noise ratio and/or the imaging times, whereas the client computers may access the server databases to extract programs and/or image acquisition and/or processing procedures from said databases.

By this arrangement, client computers may be configured in a more inexpensive manner, especially as regards memories and graphic sections. Also, limited-quality means, e.g. monitors or printers, may be provided locally, while higher-quality means are associated to the server. This provides considerable resource savings, and allows, for instance to purchase higher-quality monitors and/or other display means, such as printers or the like.

Figure 8:
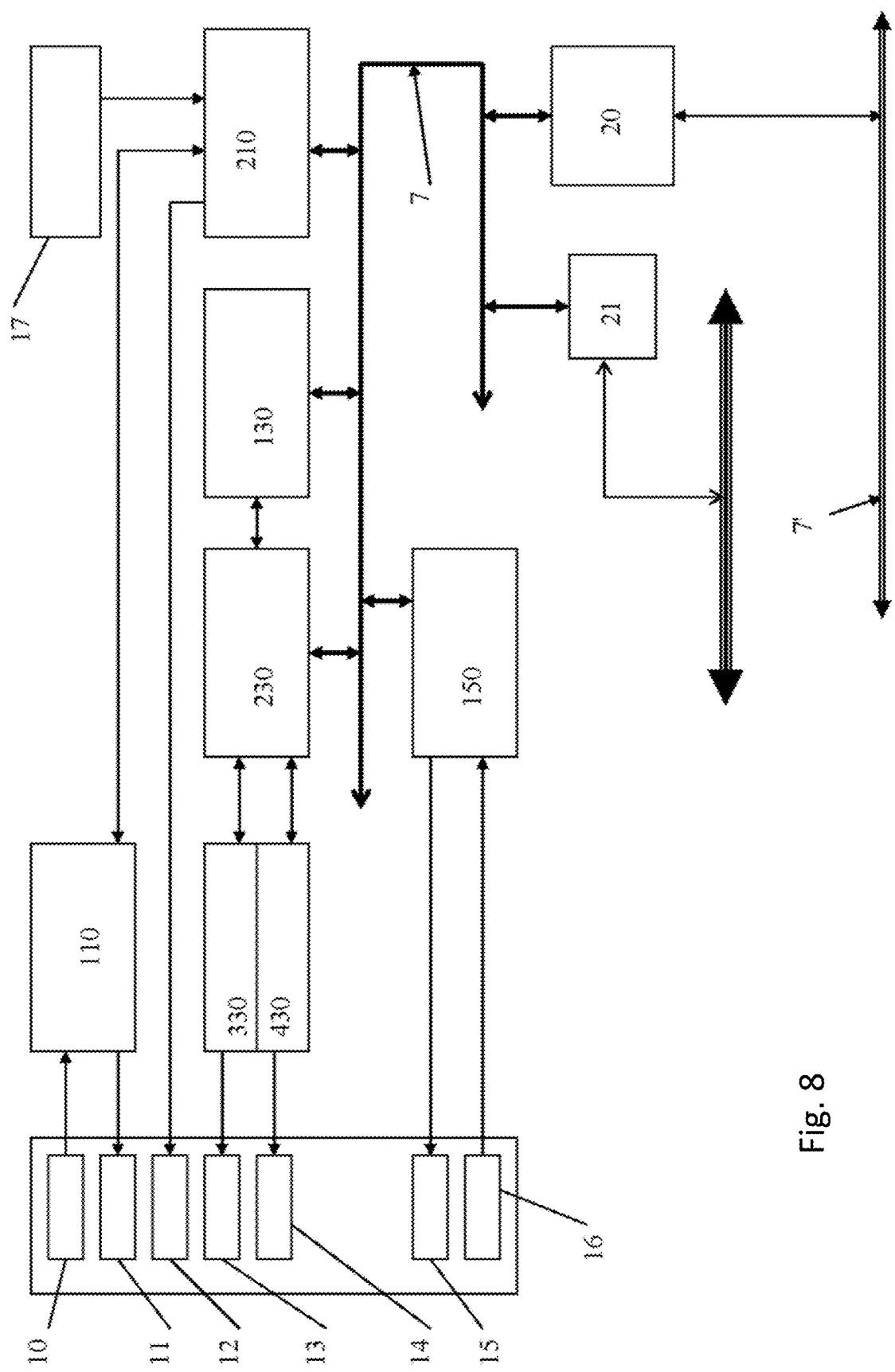
FIG. 8 is a block diagram of a variant exemplary embodiment of an MRI apparatus.

A further configuration example of an MRI system according to the invention, fit for this configuration, is shown in FIG. 8. Same functions or means in this figure are denoted with same numerals. As is evident from the comparison with FIG. 2, the units that are expressly dedicated to the control of the magnetic unit and to the reception of echo signals, as well as to signal processing to extract image data are identical to those described with reference to FIG. 6. However, unlike the previous example of FIG. 6, the apparatus has no dedicated console, but includes a local CPU unit which controls the communications between the internal bus 7 and the communication bus, e.g. a LAN network or the like, denoted with numeral 20. A modem 21 may be provided to allow communication via telephone lines. The local CPU 20, whereto local memories may be associated, accesses a local computer via the LAN network, which local computer integrates the units as described in FIG. 6 and is designed to control several machines. As mentioned above, the local computer may in turn be a client computer of a server computer for generally controlling several groups of apparatuses. The presence of an internal controlling CPU 20 does not cause a real cost increase, both due to the comparatively little cost of CPUs and to the fact that this configuration allows to reduce the number of computers dedicated to the control of machines.

Moreover, according to a further embodiment, the local CPU may be used to also control local peripherals, such as storage, display, print and control entry means.

It shall be noted that the presence of a local CPU 20 does not even hinder the possibly desired provision of one or more machines having a dedicated console.

Figure 9:
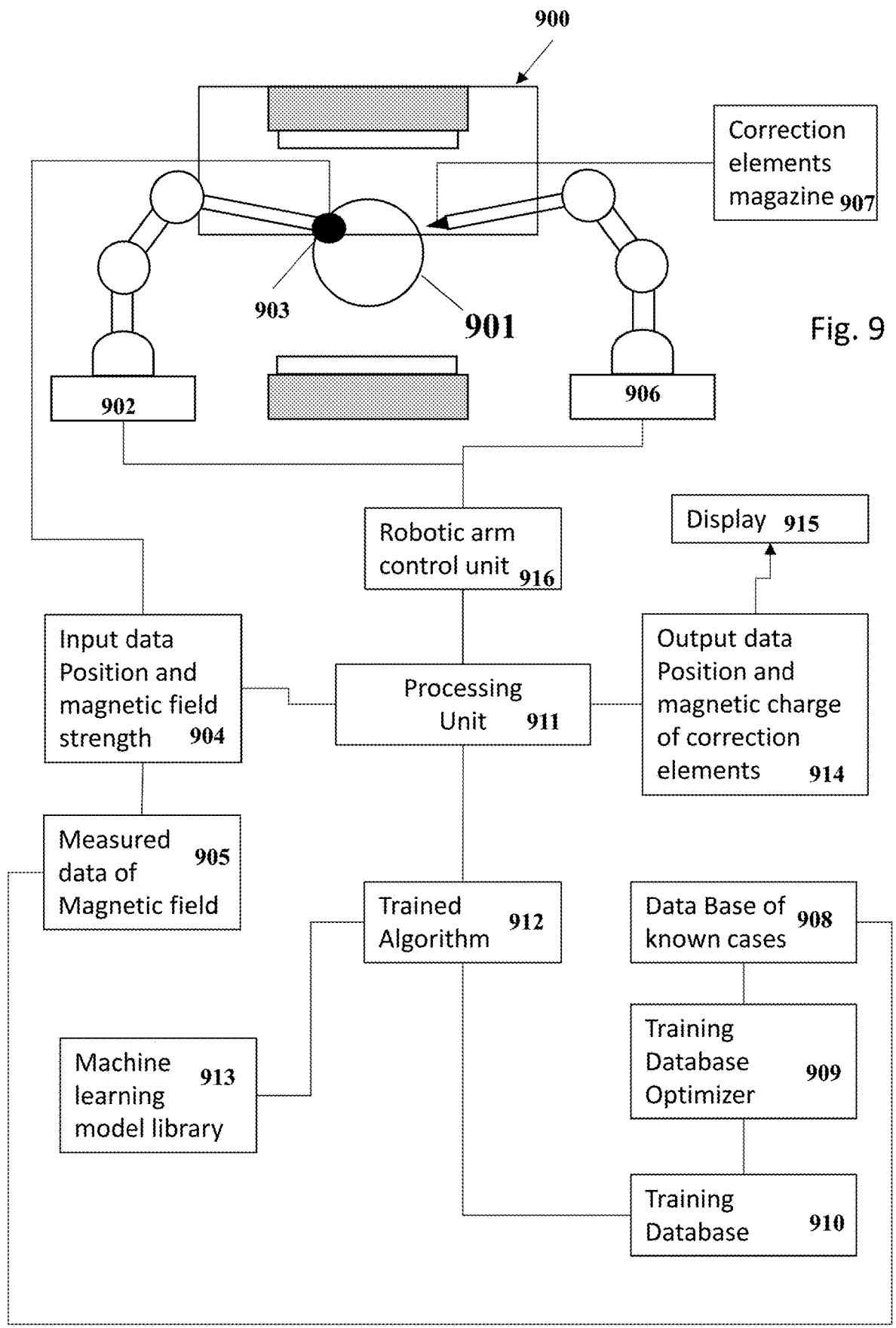
FIG. 9 shows a schematic embodiment of a system for determining the distribution of correction elements of the magnetic field according to the present invention.

FIG. 9 is a block diagram of a system for determining the distribution of correction elements of the magnetic field executing one or more algorithm provided by the one or more embodiments disclosed in relation of the method for correcting inhomogeneity of the static magnetic field particularly of the static magnetic field generated by the magnetic structure of a machine for acquiring nuclear magnetic resonance images and MRI system for carrying out such method.

In the embodiment of FIG. 9 the system for automatically determining by means of a machine learning algorithm as disclosed above in the different embodiments is configured also for automatically executing the pick and place of the correction elements determined according to the distribution computed by the algorithm and also for automatically measuring at predetermined space position the strength of the magnetic field generated by the MRI magnet in a volume.

Numeral 900 indicates a magnet and 901 a volume permeated by the magnetic field generated by the magnet. An automatic magnetic field measuring unit consisting in a robotic arm 902 carrying o its end effector a probe 903 is shown and the measured data is fed to a input interface 904 for the position of the measurement point and the magnetic field strength measured at the said points. The database comprising these data is stored in a memory 905.

Figure 1A:
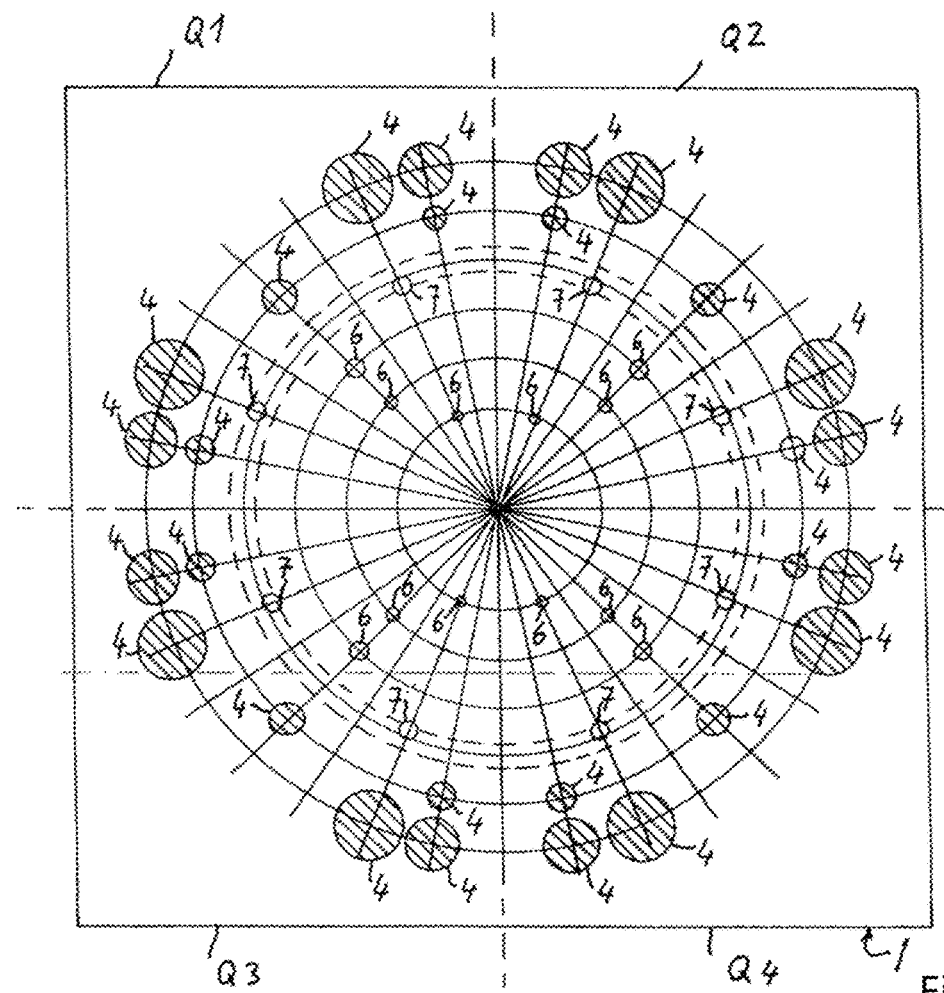
FIGS. 1A, 1B and 2 show examples of the state of the art relating to a positioning grid of a distribution of correction elements in a magnet structure of an MRI apparatus.
Figure 1B:
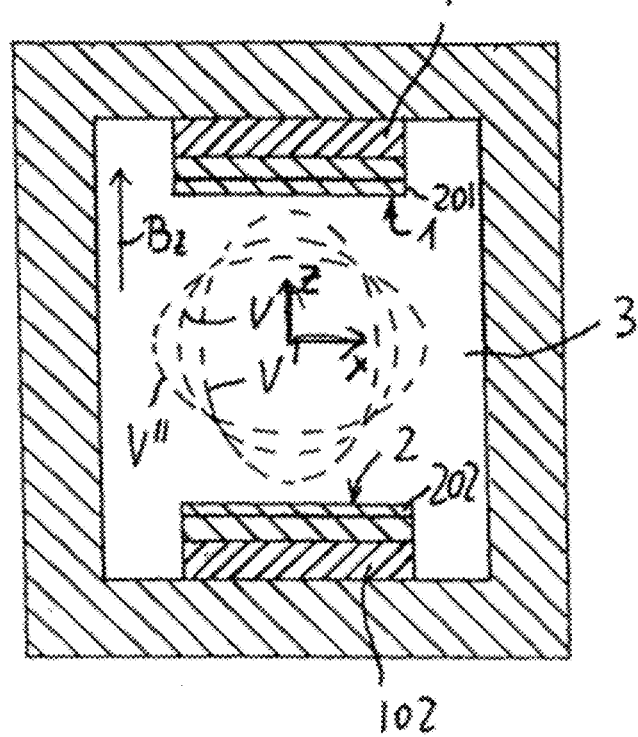

A further robotic arm may be provided indicated by 906 which carry at it end effector a grasping device for picking up one correction element from a correction elements magazine 907 and place the said correction elements at the position on a positioning grid, for example according to one of the embodiments of FIG. 1 or 2, which has been determined by the computed distribution of correction elements.

A memory is provided in which the Database of known cases 908, optionally the Training Database Optimizer 909 and the Training Database 910 are stored for being retrieved by the processing unit 911 for generating the training database 910 by executing the optimization process according to the optimizer 909 on the records of the database of known cases 908.

The processor 911 controls each one of the peripherals shown in FIG. 9 and carry out the process for training at least one algorithm for determining the distribution of correction elements to best shim the magnet of the MRI apparatus. The trained algorithm or more than one trained algorithm being executable alternatively or in combination according to different machine learning models, are store in a memory 912 and the different algorithms may be recalled from a machine learning algorithm model library 913. An output 914 provides the results of the processing as a distribution of correction elements each one having a specific position on a positioning grid and a specific magnetic charge among the ones available in the magazine. A display 915 may be provided for displaying in the form of alphanumeric data the distribution of correction elements by indicating position coordinates of the same ones and the corresponding magnetic charge and/or by showing an image of the positioning grid with the correction elements according to the computed distribution positioned on it.

The processor unit 911 controls a robotic arm control unit 916 which drives the robotic arms for carrying out their tasks. Particularly for picking the correct correction elements from the magazine and placing each one at the computed position of the positioning grid.

The above disclosed system may be a combination of dedicated hardware and software or it may be in the form of a PC or a workstation in which a software is loaded comprising the instructions to enable the conventional PC or workstation and their peripherals to carry out the functions of the unit disclosed in FIG. 9.

Figure 10:
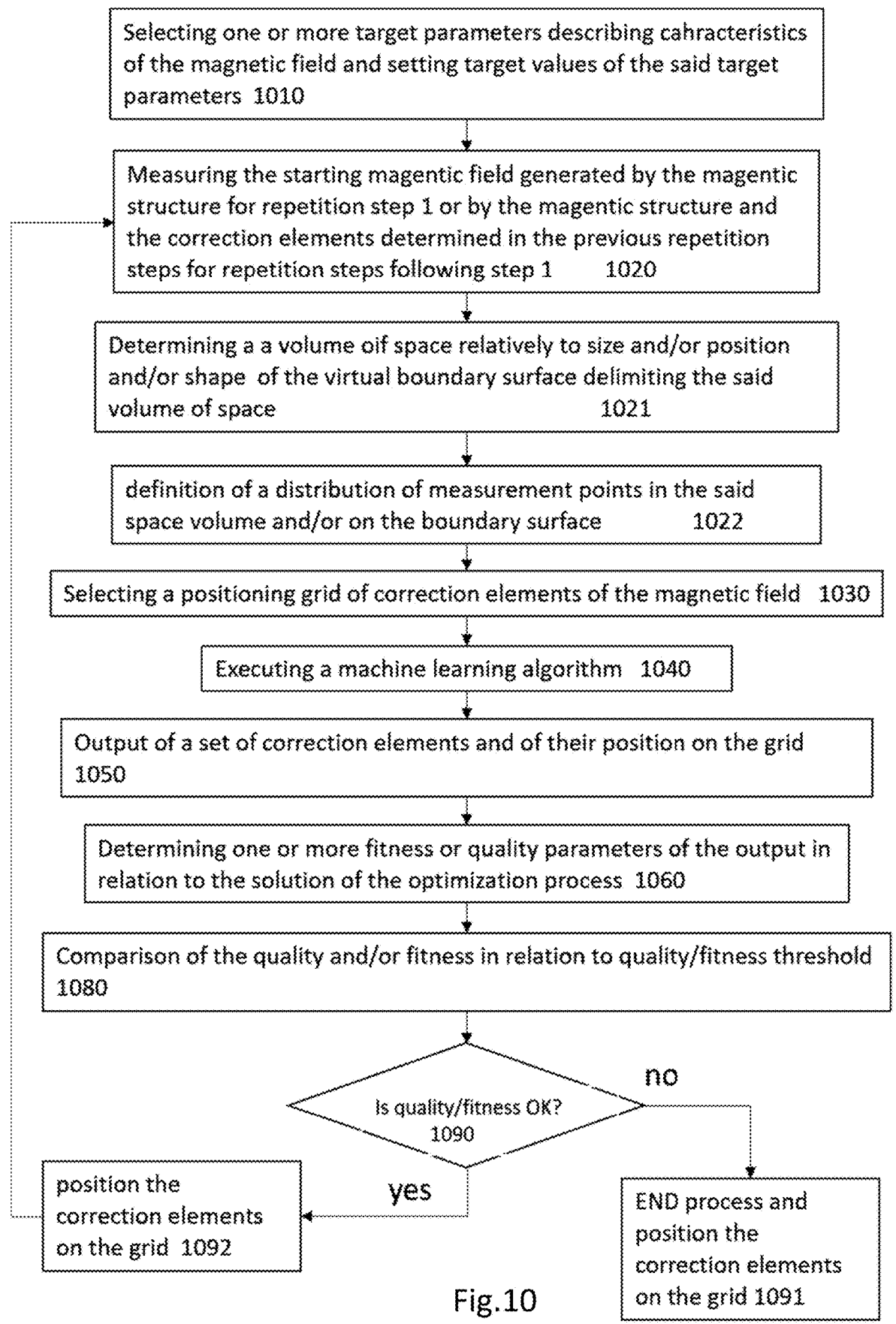
FIG. 10 is a flow diagram showing the steps of a further embodiment of the present invention.

FIG. 10 is a flow diagram showing the steps of a further embodiment of the present invention.

The example of FIG. 10 is the most general providing the use of a machine learning algorithm. In this example the training steps of the machine learning algorithm are carried out according to one or more of the techniques and methods known at the state of the art.

According to an example the machine learning algorithm is trained by a training database comprising records relating the following data of each one of a population of known cases:

the measured data of the magnetic field in its initial non optimized, i.e. shimmed condition at measuring points distributed according to a predetermined distribution in a predetermined volume of space;

optionally the size and/or the position in relation to the magnet structure and/or the shape of the boundary surface of the said volume of space;

the chosen kind of grid for positioning the correction elements of the magnetic field; the correction elements determined by the successfully executed process of optimization or shimming, each one of the said correction elements being characterized by one or more of the following parameters: position on the grid, magnetic charge, i.e. strength of the magnetic field generated by the correction elements, polarity of the magnetic field.

Obviously further data may be registered in each record.

In accordance to the way of operating of the machine learning algorithm, this algorithm are also updated in relation to their configuration by the results of each execution of the algorithm and the corresponding data of each processed case can be added to a training database.

The above training steps are not explicitly shown in the flow diagram because these steps are usual steps in training and using machine learning algorithms.

At step 1010, one or more target parameters describing the characteristics of the magnetic field are selected and the corresponding target values are set. At step 1020 the magnetic field generated by a magnetic structure to be optimized in relation to providing the said the target values of the target parameters or in minimizing the differences from the measured values and the set target values is measured.

As explained at step 1021 the measurement of the magnetic field is carried out by determining a volume of space permeated by the said field. The features describing the said volume of space can be chosen among one or more of the following ones: size and/or position in relation to the magnetic structure generating the magnetic field and/or the shape of the said volume of space, in particular the shape of a virtual boundary surface delimiting the volume of space. A further step 1022 provides for the definition of a distribution of measurement points in the said space volume and/or on the boundary surface at which points the magnetic field is measured, for example the strength of the magnetic field at each point.

At step 1030 a positioning grid of correction elements of the magnetic field is selected.

The measured data of the magnetic field at the previous steps and/or optionally also the value of the target parameters calculated basing on the measured magnetic field and/or the target values of the said target parameters are fed to a trained machine learning algorithm at step 1040.

At step 1050 the machine learning algorithm outputs a set of correction elements and the position of each one of the said correction elements on the positioning grid selected at step 1030.

As already disclosed each correction element can be characterized by one or more features being for example, the magnetic charge, i.e. the strength of the magnetic field generated by the correction element and/or the polarity and/or the size, and or the position on the grid. The set of correction elements is further characterized by the total number of correction elements and/or the total magnetic charge of the set of correction elements and/or the distribution of the charge on the grid.

The said data is furnished to the shimming personnel or to an automatic system provided with a pick and place device which provide for positioning the correction elements of the set on the positioning grid associated to the magnet structure.

As indicated in FIG. 10 further steps may be provided in the workflow.

According to a further step, indicated with 1060, a fitness value of the output data is also computed. This value is associated to the output data as an indication of the quality of the optimization and/or it can be used as a parameter for evaluating if a further processing step is needed for improving the precision of the optimization of the effective target parameters obtained for the magnetic field generated by the magnetic structure and by the correction elements added to the said magnetic structure.

According to a further step which can be also provided optionally, in alternative or in parallel to the said fitness value, a step for determining the quality of the output in optimizing the magnetic field relatively to the target values of the target parameters is also calculated. In the said further exemplary step the said quality value is calculated as a function of the values of the target data determined by measuring the magnetic field generated by the magnetic structure together with the contributions of the correction elements and the target values of the said target parameters set in the above step 1010. Possible functions are geometric means, standard deviations, variance, or other statistical functions known in the art.

The above quality parameters of the output alternatively or in combination can be used for a step of determining whether in relation to a predetermined threshold parameter the process is to be repeated starting from the magnetic field optimized by the set of correction elements determined in the previous step according to the above description.

This step indicated as 1080 may comprise the following sub steps: setting a threshold for the quality parameter of the solution relating to the output of the learning algorithm; comparing the said threshold value with the one or more quality parameters computed according to step 1070; depending on the result of the comparison at step 1090, ending the process considering the output of the set of correction elements and of their position on the gird as the best solution as indicated by 1091 or providing for repeating the process starting this time from the measurement of the magnetic field generated by the magnetic structure and by the correction elements positioned on the grid and determined by the previous steps/steps at step 1092.

The repetition of the steps from 1020 to 1090 and 1091 or 1092 can be carried out by using again the same machine learning algorithm or by using a different one. It is clear that if a different machine learning algorithm is used to carry out a following iteration step then also this further algorithm has to be trained using a database of known cases such as the one disclosed above and used for training the first machine learning algorithm.

According to a further embodiment, the machine learning algorithm can be used for carrying out a first iteration step of the optimization or minimization process, particularly of the minimization process of the inhomogeneity of the magnetic field in a volume of space as defined above or the minimization process of the differences between a target magnetic field having target values of target parameters describing features of the magnetic field and the effectively generated magnetic field and the values for this field of the target parameters. At least one of the following iteration steps of the method can be carried out by using an analytical optimization method according to the state of the art.

Figure 11:
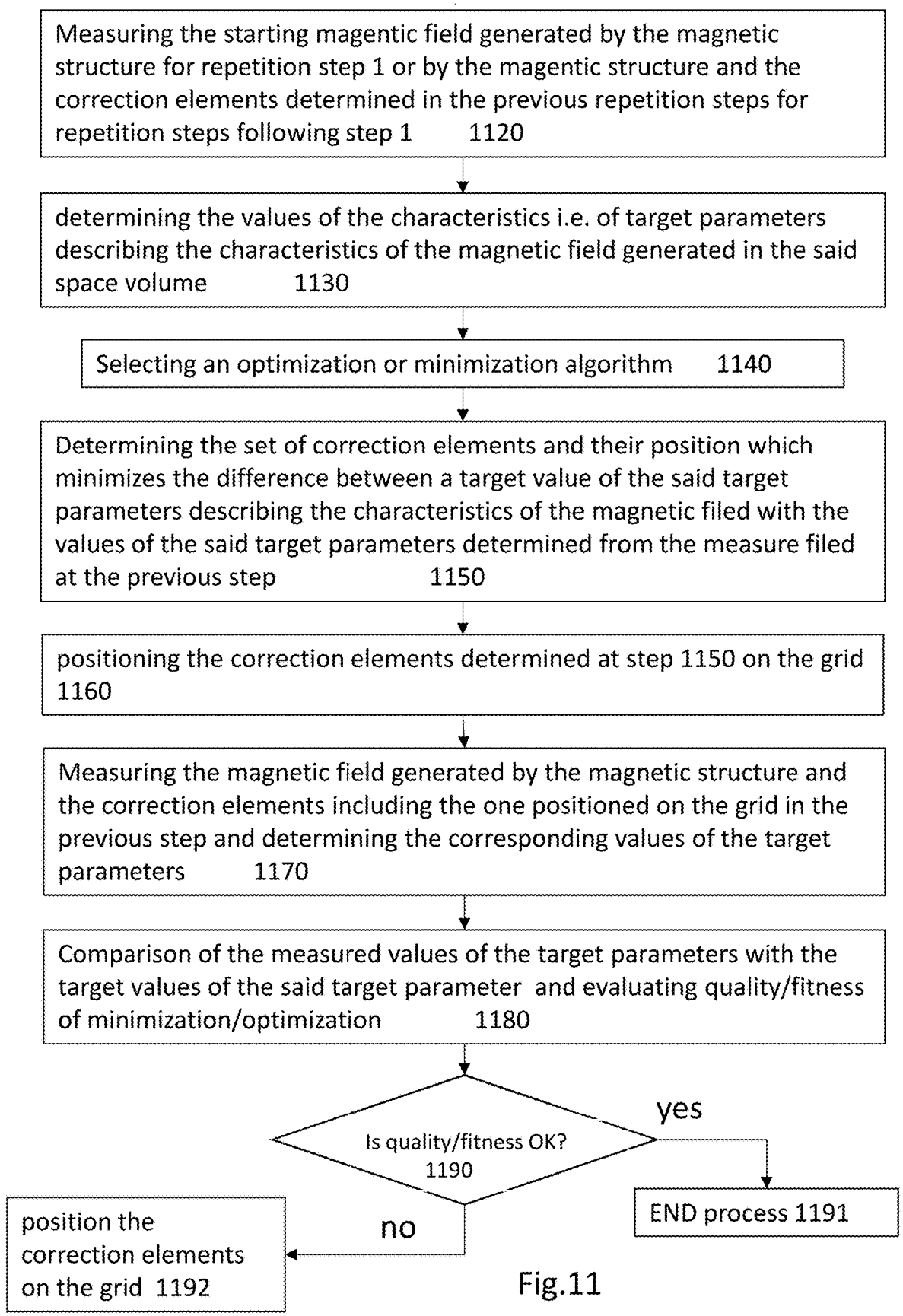
FIG. 11 shows one exemplary embodiment of the main steps of an optimization/minimization iteration step according to a known technique.

FIG. 11 shows one exemplary embodiment of the main steps of an optimization/minimization iteration step according to a known technique. The volume of space, the distribution of the measuring points on the volume of space, the grid, and the quality threshold of the optimization/minimization process, i.e. of the reduction of the inhomogeneity has been set in the previous iteration step according to FIG. 10. At step 1120 the magnetic field resulting from the combination of the magnet structure and the correction elements determined in the first iteration step of FIG. 10 is measured and the values of the target parameters describing the characteristics of the filed being of interest, i.e. the homogeneity/inhomogeneity of the magnetic field are calculated from the measure magnetic field at step 1130. At step 1140 a minimization/optimization algorithm is selected among several possibilities known at the state of the art.

The minimization/optimization algorithm can be formulated in a cost function to be minimized and being a function minimizing the differences between the target values and the values of the target parameters effectively obtained for the generated magnetic field. An example can be using an algorithm applying the method of the least squares, or other regression methods. Alternatively, the optimization algorithm can be a machine learning algorithm such as for example a genetic algorithm. Also algorithms based on the analytical description of the magnetic field as a polynomial expansion and the minimization of the differences between the coefficients of the polynomial expansion describing the field having the target values of the target parameters and the magnetic field generated effectively may be used as disclosed in the state of the art documents cited above.

The execution of the algorithm provides at step 1150 a set of correction elements which minimizes the difference between a target value of the said target parameters describing the characteristics of the magnetic field with the values of the said target parameters determined from the measured field at the previous step.

At step 1160 the correction elements are positioned on the grid and at step 1170 the magnetic field effectively generated by the combination of magnetic structure and correction elements is measured again. The values of the target parameters produced by this field are calculated and at step 1180 these values are compared with the target values for determining a quality/fitness condition or parameter.

If the result satisfies a quality/fitness criteria of minimization/optimization such as a threshold value for the quality/fitness parameter as defined in the previous iteration step of FIG. 10, then at step 1190 the decision is taken to end the process and maintain the current configuration of correction elements as indicated at step 1191. If the result is not satisfying, i.e. if the quality/fitness criteria is not met, then a further iteration step of the optimization/minimization process can be carried out as indicated at step 1192.

According to an embodiment this third step and or the further steps can be carried out by repeating the process disclosed in FIG. 11 or by repeating the process disclosed in FIG. 10.

As it appears clearly to the skilled person any kind of combination of the two process may be used to achieve the shimmed magnetic field having the desired features i.e. the desired homogeneity.

According to an exemplary embodiment the process steps according to the embodiment of FIG. 10 and the process according to FIG. 11 may be repeated alternatively in a sequence of repetition steps.

According to still a further embodiment, the first iteration step of the method according to the present invention may consist in carrying out a traditional optimization/minimization method for example according to the example of FIG. 11 which is followed then by an iteration step in which the optimization/minimization is carried out using a machine learning algorithm for example according to the embodiment of FIG. 10.

In this configuration the machine learning algorithm can be used to help the person charged with the optimization/minimization process or the automatic system configured to carry out the optimization/minimization process, i.e. the shimming process such as for example the one disclosed in FIG. 9 to chose the best one of possible alternative sets of correction elements suggested as result of the optimization/minimization iteration step according to the known methods and thus in providing the best and more rapidly converging solution.

Indeed, the current methods for example according to the one disclosed in FIG. 11 often provides alternative solutions of the minimization/optimization step which need a choice by the person in charge of the optimization/minimization process. This choice is made basing on objective criteria, but also on skills of the person in charge of the process which cannot so easily fixed in rules and which are related to personal skills. In this condition basing on the fact that the not reproducible personal skills are intrinsically contained in the final solution and in the choice, by generating a training database of data in which a number of known cases is registered in relation to the features of the initial magnetic field data, the alternatives solutions furnished by the optimization/minimization algorithm at an iteration/repetition step and the choice made by the person in charge of the shimmimg, a machine learning algorithm helps for fixing the personal skills and transforming these skills in a reproducible process.

A trained machine learning algorithm on a training database as the one described above can then be used in a optimization/minimization process for discriminating between the alternative solutions suggested by the optimization/minimization algorithm and suggesting a choice among the alternative solutions i.e. a choice of the alternative sets of correction elements furnished as valid alternative solution of the optimization/minimization step.

Any kind of combination of the above disclosed main optimization/minimization processes can be used and the configuration of the method can be determined and set case by case depending on the specific needs.

In a specific embodiment the primary target feature and target parameter is the homogeneity of the magnetic field. This means the minimization of the inhomogeneity below a certain rate expressed in ppm. So, characteristics of the magnetic field is to be interpreted as the inhomogeneity of the magnetic field. Nevertheless it has to be understood that other features of the magnetic field can be of interest alternatively to homogeneity or in combination such as particular shapes of the equipotential field lines, a variation of magnetic field in time and/or space according to a specific function or other features and the method according to the present invention may be used in order to optimize the magnetic field in relation to a target magnetic field which is to be equivalently interpreted as minimization of certain parameters describing the features of interests or maximization of the said parameters as well as minimization of the differences between a target configuration and the effectively generated configuration of the magnetic field.

In relation to the nature of the correction elements, these correction elements are small magnetic dipoles which are characterized by a magnetic charge, i.e. a strength of the magnetic field generated and a polarity and further by a certain geometric shape and size.

Figure 12:
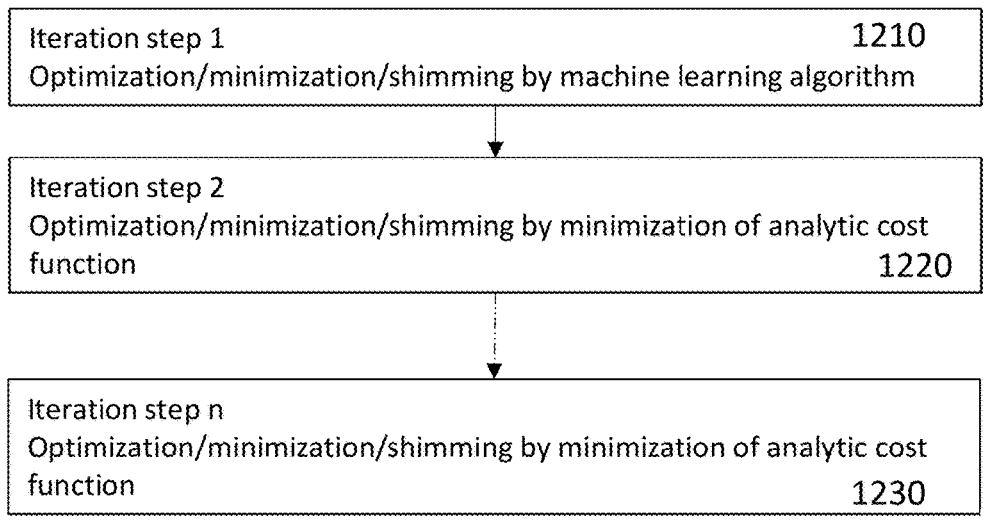
FIG. 12 shows a first iteration/repetition step carried out by using a machine learning algorithm according to an exemplary embodiment.
Figure 13:
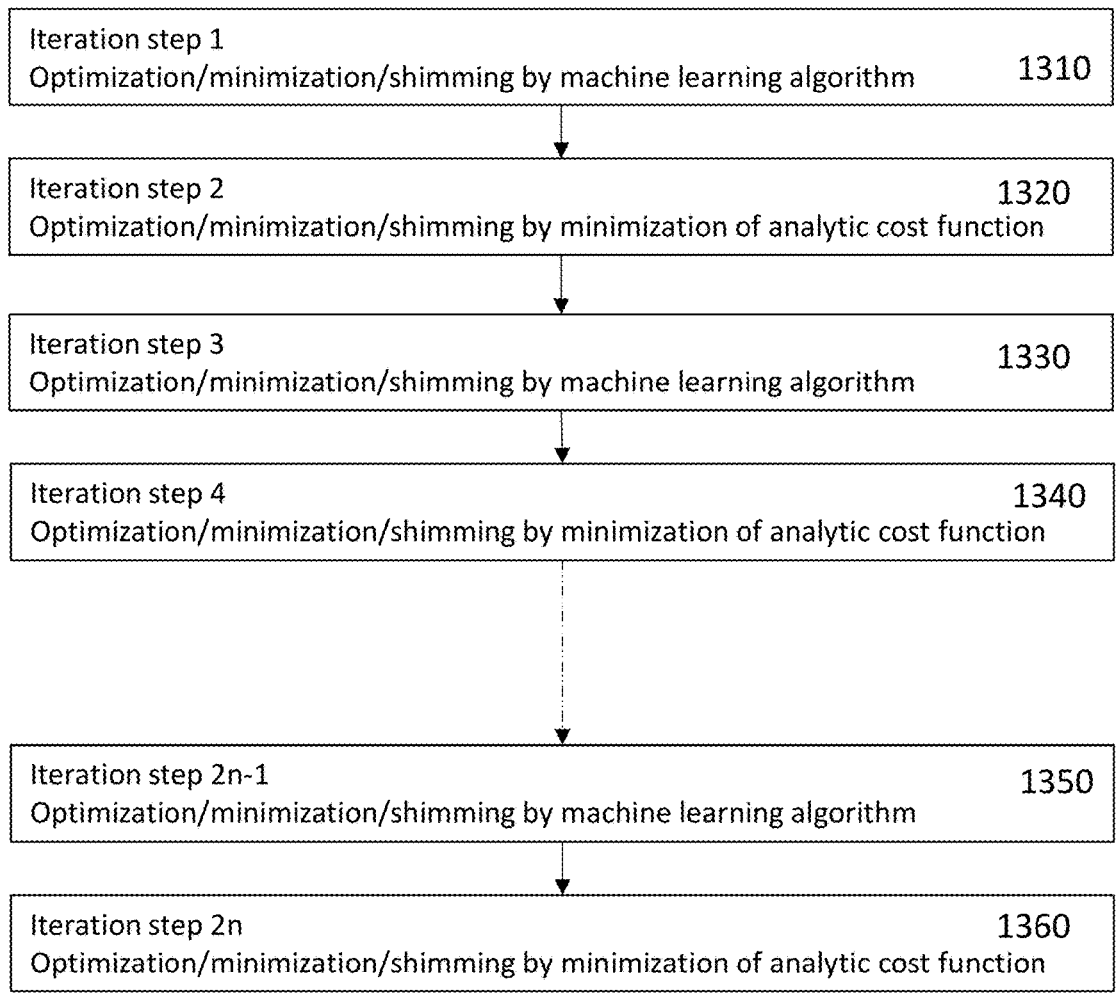
FIG. 13 shows a configuration of an iterative optimization/minimization process of a shimming process for reducing the magnetic field inhomogeneity according to a preferred embodiment.

FIGS. 12 and 13 show respectively a high lever flow diagram relating to the combination of repetition/iteration steps according to the embodiments disclosed above with more detail and generalized in relation to the particular steps of each repetition step.

In FIG. 12 the first iteration/repetition step is carried out by using a machine learning algorithm according to step 1210. The following repetition/iteration step 1220 is carried out by using a method according to the state of the art. One example has been already disclosed in the above description. Further examples are disclosed in the above cited publications and also any further optimization/minimization algorithm in particular relating to shimming of the magnet structure in order to reduce the inhomogeneity of the magnetic field can be used. The possible further repetition/iteration steps are then carried out by repeating step 1220 as indicated by step 1230.

FIG. 13 shows the configuration of the iterative optimization/minimization process, i.e. of the shimming process for reducing the magnetic field inhomogeneity in which iteration step 1, 1320, is carried out by using a machine learning algorithm and the following iteration/repetition steps 1320, 1330, 1340, 1350, 1360 are carried out by alternating the used of analytical optimization/minimization algorithms and machine learning algorithms.

A further embodiment not shown but which may be derived from the one of FIG. 13 provides for an inversion of the sequence of steps in the sense that step 1 is carried out by applying an analytical optimization/minimization algorithm and the following steps 2 is carried out by using a machine learning algorithm. The sequence of iteration is then correspondingly prosecuted by alternating an iteration step such as step 3 using an analytic optimization/minimization algorithm followed by step 4 using a machine learning algorithm and so on.

In this case the steps using the machine learning algorithms may be directed not to determine a further set of correction elements to be added to the ones determined in the previous step, but to at least guide a choice or to determine a choice of a set of correction elements between different alternative sets of correction elements determined at the previous step of execution of the optimization/minimization algorithm according to the known techniques.

The invention claimed is:

1. A method for shimming a magnetic field comprises:
   a) measuring the magnetic field and sampling it in a plurality of locations, with a predetermined space distribution within a predetermined volume of space permeated by the magnetic field and delimited by a surface boundary or also on the surface boundary;
   b) defining a grid for positioning correction elements based on a magnet structure and on a correlation thereof with a magnetic field structure;
   c) calculating position and magnitude parameters of one or more correction elements to obtain predetermined target values of magnetic field characteristics, in which the step c) is carried out by a machine learning algorithm or combinations thereof,
   which algorithm has been trained by a database of known cases in which each record links a certain initial magnetic field of a magnetic structure to a pattern of correction elements on a positioning grid for these correction elements in the magnet structure, thereby delivering as an output a pattern of correction elements on the positioning grid which contributions to the magnetic field of the magnet structure generate a magnetic field which at least approximates or meets the said predetermined target values of the field characteristics, and
   wherein a distribution of correction elements of a certain predetermined positioning grid is combined with a training process which provides for a selection of specific records from the database of known cases which allows to generate a training database providing training of the machine learning algorithm,
   wherein the training process also provides a step for reducing a number of correction elements on a grid by individuating the correction elements of the distribution of correction elements which can be substituted by a less number of correction elements at different positions and having a different magnetic charge.

2. The method according to claim 1 in which the machine learning algorithm is set as to predict the distribution of correction elements on a grid for positioning the correction elements in a magnet structure which minimizes a difference between a theoretically wanted magnetic field and a measured magnetic field.

3. The method according to claim 1 in which the machine learning algorithm is a predictive algorithm trained on the database of known cases and which uses as an input sample data of the magnetic field effectively measured and as an output the pattern of the correction elements on the grid.

4. The method according to claim 3 in which the machine learning algorithm is trained by a training database comprising records relating to the following data of each one of a population of known cases:

the measured data of the magnetic field in its initial non optimized, i.e., shimmed condition, at measuring points distributed according to a predetermined distribution in a predetermined volume of space;
optionally the size or the position in relation to the magnet structure or the shape of the boundary surface of the said volume of space;
the chosen kind of grid for positioning the correction elements of the magnetic field;
the correction elements determined by the successfully executed process of optimization or shimming, each one of the said correction elements being characterized by one or more of the following parameters: position on the grid, magnetic charge, i.e., strength of the magnetic field generated by the correction elements, and polarity of the magnetic field.

5. The method according to claim 1 in which the machine learning algorithm is chosen as one or a combination of the following algorithms:
   a genetic algorithm in which the distribution of correction elements on a certain grid which cancels or reduces the inhomogeneities is calculated by combining known distributions in a database of known cases in order to generate a distribution of correction elements minimizing the inhomogeneities, the evolutionary process for combining the known distributions in order to generate the next generations is guided by an inhomogeneity pattern of the magnetic field corrected through the distribution of correction elements resulting from the theoretical calculation of the magnetic field at predetermined measuring positions on a grid of measuring points defined in a volume permeated by the magnetic field;
   a predictive algorithm consisting in a neural network in which nodes represents the grid of the correction elements and a matrix of the weights which comprises a weight applied to each activation function of each node is the output determining the magnetic field of the correction element at a certain position of the grid;
   a classification algorithm; or a combination of two or more of the above algorithms.

6. The method according to claim 1 in which the training process is optimized.

7. The method according to claim 1 in which the steps a) to c) are repeated two or more times and in which at each repetition/iteration the magnetic field measured is the field generated by the magnetic structure in combination with the magnetic field generated by the correction elements determined and placed as the result of the previous repetitions/iterations,
   the number of repetitions/iteration in a sequence of repetitions/iterations is terminated according to one criteria or to a combination of criteria of the following list: the measured inhomogeneity of the shimmed magnetic field is below a predetermined maximum inhomogeneity threshold, the number of repetitions has reached a predetermined maximum number of repetitions, the rate of reduction of the inhomogeneity at each step falls below a minimum rate value, i.e. each new repetition does not provide for a relevant further reduction of the inhomogeneity in relation to the previous ones and/or the difference of the effectively generated magnetic field in relation to a desired theoretically determined target field are below a certain maximum value of a parameter or a combination of parameters describing the said difference between the magnetic fields.

8. A method according to claim 1 in which a first iteration is carried out according to the steps a) to c) while at least a further repetition or iteration is carried out according to the following steps:
  i) measuring the magnetic field generated by the magnets and by the contributions to the magnetic field of the magnet due to the correction elements calculated in steps a) to c) and sampling it in a plurality of locations, with a predetermined space distribution in the said space volume of step a);
  ii) determining the values of the characteristics i.e. of target parameters describing the characteristics of the magnetic field generated in the said space volume;
  iii) calculating the position and the magnetic field magnitude of said one or more correction elements to obtain the magnetic field of the magnetic structure in combination with the contribution of the said one or more correction elements positioned on the said grid which minimizes the differences of the measured values of the characteristics of the said generated magnetic field with the said target values of the characteristics of the magnetic field;
  iv) positioning the correction elements determined at step iii) on the grid;
  v) measuring the values of the characteristics of the magnetic field generated by the magnet structure and the correction elements resulting from the previous steps a) to c) and i) to iv);
  vi) determining if the said measured values of the characteristics of the generated magnetic field at step v) minimizes the differences of the measured values of the characteristics of the said generated magnetic field with the said target values of the characteristics of the magnetic field;
  vii) repeating the process according to step a) to c) or the process according to step i) to vi) until the said difference is below the said maximum threshold or the target values are met by the measured ones;
  viii) ending the process if the above condition of step vii) is met.

9. The method according to claim 1, wherein the predetermined volume of space is permeated by the magnetic field and delimited by the surface boundary and on the surface boundary.

10. A method for shimming a magnetic field comprises:
  a) measuring the magnetic field and sampling it in a plurality of locations, with a predetermined space distribution within a predetermined volume of space permeated by the magnetic field and delimited by a surface boundary or also on the surface boundary;
  b) defining a grid for positioning correction elements based on a magnet structure and on a correlation thereof with a magnetic field structure;
  c) calculating position and magnitude parameters of one or more correction elements to obtain predetermined target values of magnetic field characteristics, in which the step c) is carried out by a machine learning algorithm or combinations thereof,
  which algorithm has been trained by a database of known cases in which each record links a certain initial magnetic field of a magnet structure to a pattern of correction elements on a positioning grid for these correction elements in the magnet structure, thereby delivering as an output a pattern of correction elements on the positioning grid which contributions to the magnetic field of the magnet structure generate a magnetic field which at least approximates or meets the said predetermined target values of the field characteristics
  wherein the algorithm is executed by
  individuating a symmetry of the magnet structure or of the grid and dividing the magnet structure or the grid or the magnetic field into sectors according to the said symmetry;
  determining the one or more correction elements and their positions on the grid within the said one first sector;
  projecting the said one or more correction elements and their positions on the grid from the said first one sector to each of the further sectors according to the symmetry; and
  carrying out the above steps for each repetition/iteration step/steps of the method when one or more of such repetition/iteration steps are provided.

11. A for shimming a magnetic field comprises:
  a) measuring the magnetic field and sampling it in a plurality of locations, with a predetermined space distribution within a predetermined volume of space permeated by the magnetic field and delimited by a surface boundary or also on the surface boundary;
  b) defining a grid for positioning correction elements based on a magnet structure and on a correlation thereof with a magnetic field structure;
  c) calculating position and magnitude parameters of one or more correction elements to obtain predetermined target values of magnetic field characteristics, in which the step c) is carried out by a machine learning algorithm or combinations thereof,
  which algorithm has been trained by a database of known cases in which each record links a certain initial magnetic field of a magnetic structure to a pattern of correction elements on a positioning grid for these correction elements in the magnet structure, thereby delivering as an output a pattern of correction elements on the positioning grid which contributions to the magnetic field of the magnet structure generate a magnetic field which at least approximates or meets the said predetermined target values of the field characteristics;
  wherein a first repetition/iteration step is carried out according to the following steps:
  i) measuring the magnetic field generated by the magnets and by the contributions to the magnetic field of the magnet due to the correction elements calculated in steps a) to c) and sampling it in a plurality of locations, with a predetermined space distribution in the said space volume of step a);
  ii) determining the values of the characteristics of the magnetic field generated in the said space volume;
  iii) calculating the position and the magnetic field magnitude of said one or more correction elements to obtain the magnetic field of the magnetic structure in combination with the contribution of the said one or more correction elements positioned on the said grid which minimizes the differences of the measured values of the characteristics of the said generated magnetic field with the said target values of the characteristics of the magnetic field;
  iv) in presence of one or more different alternative solutions consisting each one of a different set of correction elements in relation to the strength of the magnetic field, the position and or the polarity of the magnetic field and or the number of the said correction element, determining a set of correction elements by using a machine learning algorithm trained with a database recording the measured magnetic field from which the processing step is started and/or the measured values of the characteristics of the field and/or the corresponding target values and/or the obtained differences between measure values and target values of the magnetic field and/or the set of correction elements and corresponding positions chosen in executing shimming process of known cases;

v) executing the previous steps i) to iv) using the set of correction elements and of the corresponding position determined by the machine learning algorithm.

\* \* \* \* \*